US012125820B2

(12) United States Patent
Chen et al.

(10) Patent No.: US 12,125,820 B2
(45) Date of Patent: Oct. 22, 2024

(54) THROUGH-DIELECTRIC VIAS FOR DIRECT CONNECTION AND METHOD FORMING SAME

(71) Applicant: Taiwan Semiconductor Manufacturing Co., Ltd., Hsinchu (TW)

(72) Inventors: Ming-Fa Chen, Taichung (TW); Chuan-An Cheng, Zhubei (TW); Sung-Feng Yeh, Taipei (TW); Chih-Chia Hu, Taipei (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 98 days.

(21) Appl. No.: 17/229,283

(22) Filed: Apr. 13, 2021

(65) Prior Publication Data

US 2022/0262766 A1 Aug. 18, 2022

Related U.S. Application Data

(60) Provisional application No. 63/148,642, filed on Feb. 12, 2021.

(51) Int. Cl.
*H01L 23/28* (2006.01)
*H01L 21/56* (2006.01)
(Continued)

(52) U.S. Cl.
CPC ........ *H01L 25/0652* (2013.01); *H01L 21/565* (2013.01); *H01L 21/568* (2013.01);
(Continued)

(58) Field of Classification Search
None
See application file for complete search history.

(56) References Cited

U.S. PATENT DOCUMENTS 8,361,842 B2 1/2013 Yu et al.
8,680,647 B2 3/2014 Yu et al.
(Continued)

FOREIGN PATENT DOCUMENTS

DE 102019128274 A1 12/2020
DE 102019130567 A1 1/2021
(Continued)

*Primary Examiner* — Trang Q Tran
(74) *Attorney, Agent, or Firm* — Slater Matsil, LLP

(57) ABSTRACT

A method includes bonding a tier-1 device die to a carrier, forming a first gap-filling region to encapsulate the tier-1 device die, forming a first redistribution structure over and electrically connected to the tier-1 device die, and bonding a tier-2 device die to the tier-1 device die. The tier-2 device die is over the tier-1 device die, and the tier-2 device die extends laterally beyond a corresponding edge of the tier-1 device die. The method further includes forming a second gap-filling region to encapsulate the tier-2 device die, removing the carrier, and forming a through-dielectric via penetrating through the first gap-filling region. The through-dielectric via is overlapped by, and is electrically connected to, the tier-2 device die. A second redistribution structure is formed, wherein the first redistribution structure and the second redistribution structure are on opposing sides of the tier-1 device die.

20 Claims, 35 Drawing Sheets

(51) Int. Cl.

| | |
|---|---|
| ***H01L 21/683*** | (2006.01) |
| ***H01L 21/768*** | (2006.01) |
| ***H01L 23/00*** | (2006.01) |
| ***H01L 23/31*** | (2006.01) |
| ***H01L 23/48*** | (2006.01) |
| ***H01L 23/538*** | (2006.01) |
| ***H01L 25/00*** | (2006.01) |
| ***H01L 25/065*** | (2023.01) |

(52) U.S. Cl.

CPC .... *H01L 21/6835* (2013.01); *H01L 21/76898* (2013.01); *H01L 23/3128* (2013.01); *H01L 23/481* (2013.01); *H01L 23/5386* (2013.01); *H01L 23/5389* (2013.01); *H01L 24/08* (2013.01); *H01L 24/80* (2013.01); *H01L 25/50* (2013.01); *H01L 2221/68372* (2013.01); *H01L 2224/08145* (2013.01); *H01L 2224/80006* (2013.01); *H01L 2224/80895* (2013.01); *H01L 2224/80896* (2013.01); *H01L 2225/06541* (2013.01); *H01L 2225/06548* (2013.01); *H01L 2225/06586* (2013.01)

(56) References Cited

U.S. PATENT DOCUMENTS

| | | | | |
|---|---|---|---|---|
| 8,703,542 | B2 | 4/2014 | Lin et al. | |
| 8,759,964 | B2 | 6/2014 | Pu et al. | |
| 8,778,738 | B1 | 7/2014 | Lin et al. | |
| 8,785,299 | B2 | 7/2014 | Mao et al. | |
| 8,803,306 | B1 | 8/2014 | Yu et al. | |
| 8,809,996 | B2 | 8/2014 | Chen et al. | |
| 8,829,676 | B2 | 9/2014 | Yu et al. | |
| 8,877,554 | B2 | 11/2014 | Tsai et al. | |
| 9,087,835 | B2 | 7/2015 | Sutardja et al. | |
| 9,825,007 | B1 * | 11/2017 | Chen | H01L 21/486 |
| 9,935,087 | B2 | 4/2018 | Zhai et al. | |
| 11,133,258 | B2 | 9/2021 | Yu et al. | |
| 11,139,249 | B2 | 10/2021 | Yu et al. | |
| 11,171,076 | B2 | 11/2021 | Yu et al. | |
| 2011/0291288 | A1 | 12/2011 | Wu et al. | |
| 2012/0299191 | A1 * | 11/2012 | Camacho | H01L 24/97 438/109 |
| 2013/0026468 | A1 | 1/2013 | Yoshimuta et al. | |
| 2013/0062760 | A1 | 3/2013 | Hung et al. | |
| 2013/0062761 | A1 | 3/2013 | Lin et al. | |
| 2013/0168848 | A1 | 7/2013 | Lin et al. | |
| 2013/0307140 | A1 | 11/2013 | Huang et al. | |
| 2014/0103488 | A1 * | 4/2014 | Chen | H01L 24/19 257/532 |
| 2014/0203429 | A1 | 7/2014 | Yu et al. | |
| 2014/0225222 | A1 | 8/2014 | Yu et al. | |
| 2014/0252646 | A1 | 9/2014 | Hung et al. | |
| 2014/0264930 | A1 | 9/2014 | Yu et al. | |
| 2017/0133351 | A1 | 5/2017 | Su et al. | |
| 2017/0194292 | A1 * | 7/2017 | Yu | H01L 21/78 |
| 2017/0263518 | A1 | 9/2017 | Yu et al. | |
| 2019/0088581 | A1 * | 3/2019 | Yu | H01L 21/4857 |
| 2019/0131273 | A1 * | 5/2019 | Chen | H01L 21/568 |
| 2020/0118915 | A1 | 4/2020 | Yu et al. | |
| 2020/0243449 | A1 | 7/2020 | Chiang et al. | |
| 2020/0365489 | A1 | 11/2020 | Su et al. | |
| 2021/0202459 | A1 * | 7/2021 | Chang Chien | H01L 24/05 |

FOREIGN PATENT DOCUMENTS

| | | | |
|---|---|---|---|
| KR | 20170141733 | A | 12/2017 |
| KR | 20200041265 | A | 4/2020 |
| KR | 20200116866 | A | 10/2020 |
| TW | 202018831 | A | 5/2020 |
| TW | 202029449 | A | 8/2020 |
| TW | 202034484 | A | 9/2020 |

* cited by examiner

THROUGH-DIELECTRIC VIAS FOR DIRECT CONNECTION AND METHOD FORMING SAME

PRIORITY CLAIM AND CROSS-REFERENCE

This application claims the benefit of the following provisionally filed U.S. Patent application: Application No. 63/148,642, filed on Feb. 12, 2021, and entitled "A Face to Back Cross-Die Stacking Architecture," which application is hereby incorporated herein by reference.

BACKGROUND

The packages of integrated circuits are becoming increasingly more complex, with more device dies packaged in the same package to achieve more functions. For example, a package structure has been developed to include a plurality of device dies such as processors and memory cubes in the same package. The package structure can include device dies formed using different technologies and have different functions bonded to the same device die, thus forming a system. This may save manufacturing cost and optimize device performance. Some of the device dies in the die stack may include through-silicon vias for electrical connection purpose.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
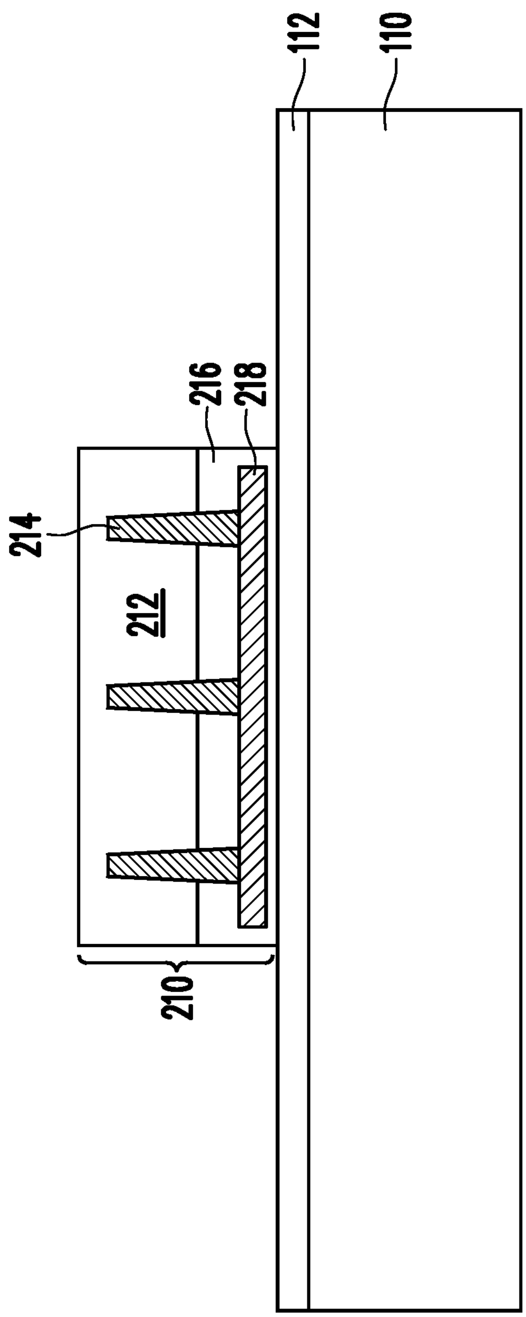
FIGS. 1 through 7 illustrate the cross-sectional views of intermediate stages in the formation of a package in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "underlying," "below," "lower," "overlying," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A package and the method of forming the same are provided in accordance with some embodiments. The package includes stacked device dies, with some device dies include through-substrate vias. The device dies may be encircled by gap-filling regions, with some through-dielectric vias penetrating through the gap-filling regions to directly interconnect two device dies, so that the connections of these two device dies don't go through the through-substrate vias and metal lines and vias in the device dies. The RC delay is thus reduced. Embodiments discussed herein are to provide examples to enable making or using the subject matter of this disclosure, and a person having ordinary skill in the art will readily understand modifications that can be made while remaining within contemplated scopes of different embodiments. Throughout the various views and illustrative embodiments, like reference numbers are used to designate like elements. Although method embodiments may be discussed as being performed in a particular order, other method embodiments may be performed in any logical order.

FIGS. 1 through 7 illustrate the cross-sectional views of intermediate stages in the formation of a package in accordance with some embodiments of the present disclosure. The corresponding processes are also reflected schematically in the process flow shown in FIG. 35.

Referring to FIG. 1, carrier 110 is provided. In accordance with some embodiments, carrier 110 is a blanket carrier formed of a homogeneous material, with the entirety of carrier 110 being formed of the same material. Carrier 110 may be a silicon carrier, a glass carrier, or the like. In accordance with some embodiments in which carrier 110 is a silicon carrier, a dielectric layer 112, which may be formed of or comprises silicon oxide, is formed on the top surface of carrier 110 for bonding. The dielectric layer 112 may be formed through the thermal oxidation of a surface layer of carrier 110, a deposition process, or the like. In accordance with alternative embodiments, dielectric layer 112 is not formed.

Figure 35:
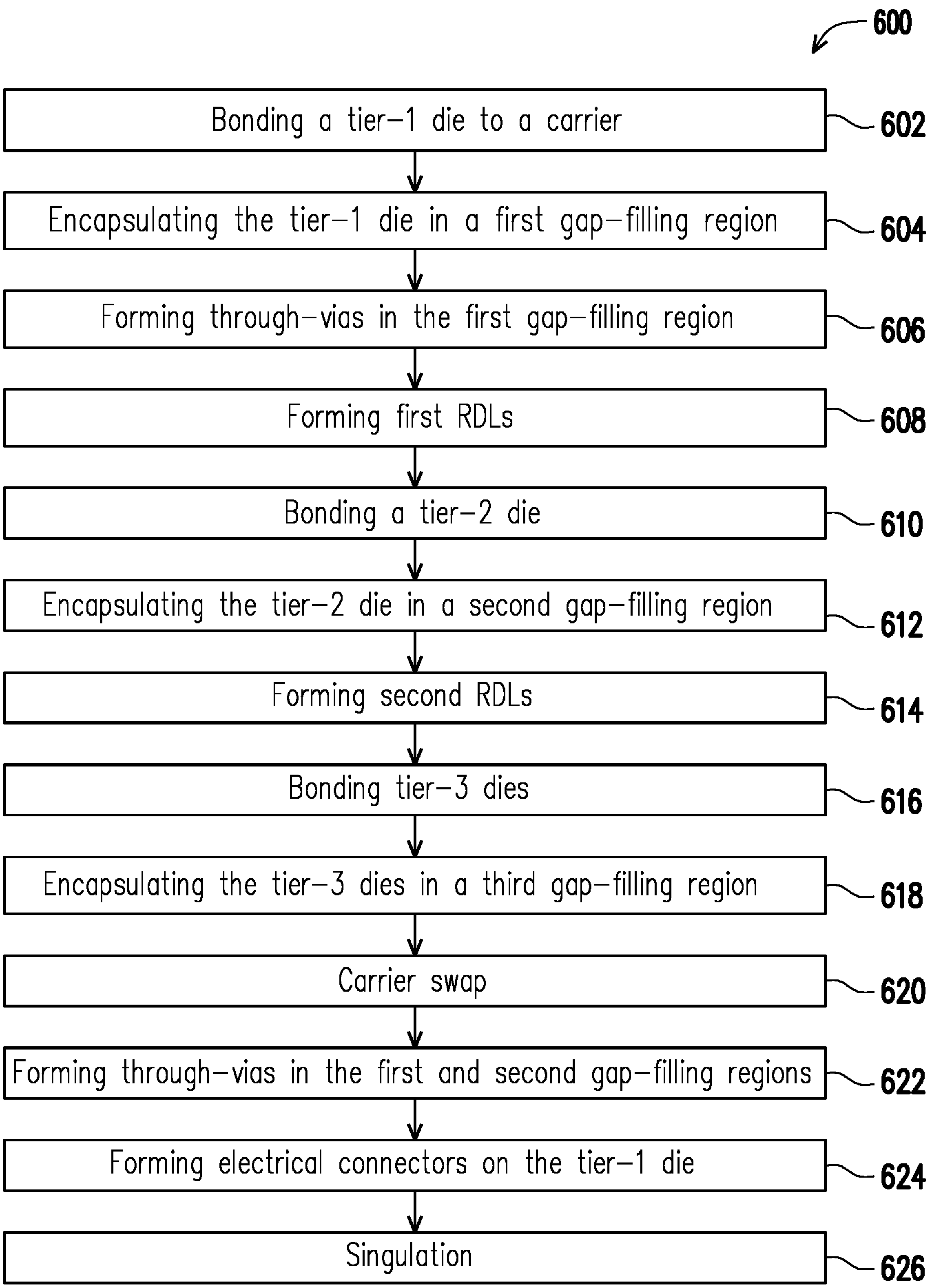
FIG. 35 illustrate the process flow for forming a package in accordance with some embodiments.

Device die 210 is placed over and bonded to carrier 110 through die-to-wafer bonding. The corresponding process is illustrated as process 602 in the process flow 600 as shown in FIG. 35. The bonding may be at wafer level. Accordingly, a plurality of device dies 210 (which may be identical to each other or different from each other) are bonded to carrier 110, although one device die 210 is illustrated. Throughout the description, the device dies 210 and other device dies illustrated in the drawings may be logic dies, memory dies, 10 dies, or the likes. For example, the logic dies may include Application Processor (AP) dies, Graphics Processing Unit (GPU) dies, Field Programmable Gate Array (FPGA) dies, Application Specific Integrated Circuit (ASIC) dies, Input-Output (IO) dies, Network Processing Unit (NPU) dies, Tensor Processing Unit (TPU) dies, Artificial Intelligence (AI) engine dies, or the like. The memory dies may be or may include Static Random Access Memory (SRAM) dies, Dynamic Random Access Memory (DRAM) dies, wide I/O memory dies, NAND memory dies, Resistive Random Access Memory (RRAM) dies, Magneto-resistive Random Access Memory (MRAM) dies, Phase Change Random Access Memory (PCRAM) dies, or the like, or other types of volatile or non-volatile memory dies.

Device die 210 includes substrate 212. In accordance with some embodiments, substrate 212 is a semiconductor substrate, which may be a crystalline silicon substrate, while it may also comprise or may be formed of other semiconductor materials such as silicon germanium, silicon carbon, or the like. In accordance with some embodiments, device die 210 includes an active circuit, which includes active devices such as transistors (not shown) formed at the illustrated bottom surface (front surface) of semiconductor substrate 212. Through-vias (sometimes referred to as Through-Substrate Vias (TSVs)) 214 may be formed to extend into substrate 212 in accordance with some embodiments. TSVs 214 are also sometimes referred as through-silicon vias when substrate 212 is a silicon substrate. Each of TSVs 214 may be encircled by an isolation liner (not shown), which is formed of a dielectric material such as silicon oxide, silicon nitride, or the like. The isolation liner isolates the respective TSVs 214 from semiconductor substrate 212. TSVs 214 extend to an intermediate level between the top surface and the bottom surface of semiconductor substrate 212. In accordance with some embodiments, the bottom surfaces of TSVs 214 are level with the illustrated bottom surface of semiconductor substrate 212. In accordance with alternative embodiments, TSVs 214 further extend down into one of dielectric layers 216. Conductive features 218 are schematically illustrated to represent the front-end conductive features including contact plugs, metal lines, vias, metal pads, metal pillars, etc.

Tier-1 device die 210 is bonded to carrier 110 through fusion bonding in accordance with some embodiments. For example, a bottom dielectric layer in device die 210 may be a silicon-containing dielectric layer formed of silicon oxide, silicon oxynitride, silicon oxycarbide, or the like. When dielectric layer 112 is not formed, device die 210 may be bonded directly to carrier 110 through fusion bonding. The fusion bonding may result in Si-O-Si bonds to be generated to bond device die 210 to carrier 110. In accordance with alternative embodiments, carrier 110 may be formed of other materials other than silicon, such as glass, an organic material, or the like. Accordingly, dielectric layer 112 may also be an adhesive layer, which may be a light-to-heat-conversion (LTHC) film.

Figure 2:
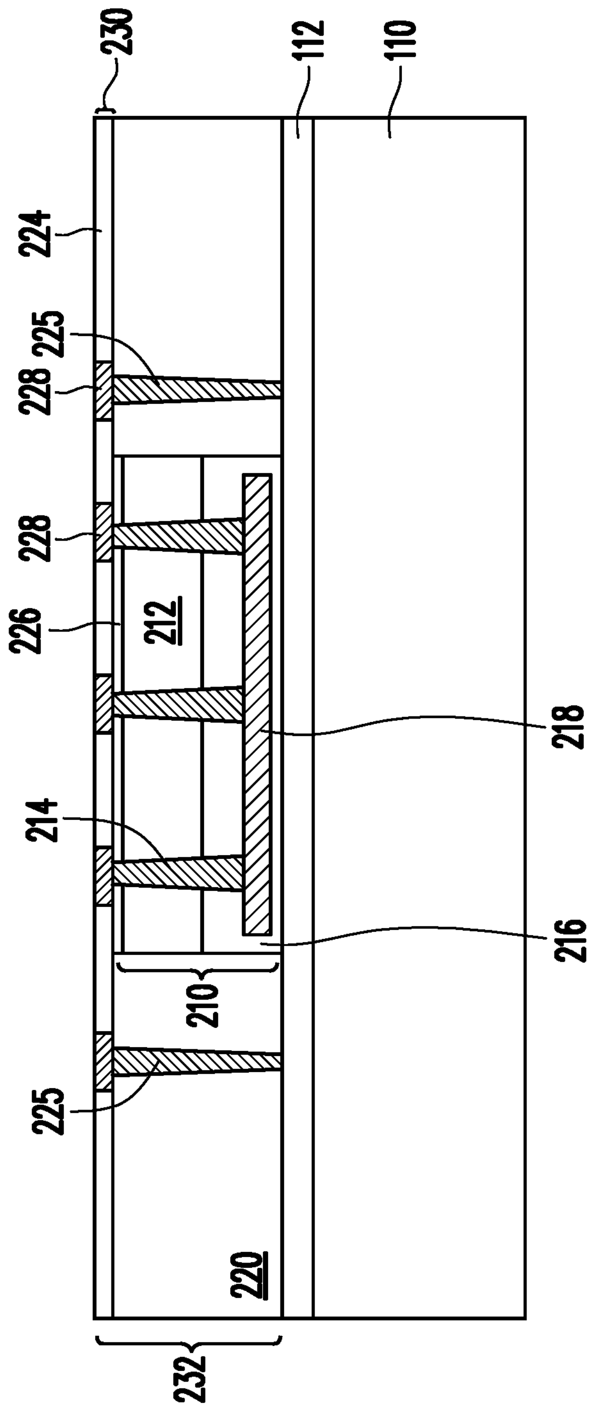

FIG. 2 illustrates the gap-filling process to encapsulating device dies 210. The corresponding process is illustrated as process 604 in the process flow 600 as shown in FIG. 35. In accordance with some embodiments, gap-filling regions 220 are formed of or comprise inorganic materials. For example, the formation of gap-filling regions 220 may include depositing a dielectric liner (which is also an etch stop layer) and a dielectric material over the dielectric liner. The dielectric liner may be a conformal layer extending to the top surface of dielectric layer 112 and the sidewalls and a top surface of device die 210. The etch stop layer is formed of a dielectric material that has good adhesion to the sidewalls of device dies 210 and the top surfaces of dielectric layer 112. In accordance with some embodiments of the present disclosure, the etch stop layer is formed of a nitride-containing material such as silicon nitride. The deposition may include a conformal deposition process such as Atomic Layer Deposition (ALD) or Chemical Vapor Deposition (CVD). The dielectric material deposited on the etch stop layer may be formed of or comprises silicon oxide. In accordance with alternative embodiments, gap-filling regions 220 are formed of a molding compound, an epoxy, a resin, and/or the like. A planarization process such as a Chemical Mechanical Polish (CMP) process or a mechanical grinding process is performed to level the back surface (the illustrated top surface) of device dies 210 with the top surface of gap-filling regions 220. The planarization process is stopped after through-vias 214 are exposed. Gap-filling regions 220 (and the subsequently formed gap-filling regions in upper tiers) encircle the corresponding device dies when viewed in a top view of the illustrated structures.

In a subsequent process, an etching process is performed to recess the back surface of substrate 212, so that a recess is formed, with the sidewalls of gap-filling regions 220 being exposed to the recess. Through-vias 214 are not recessed, so that the end portions of through-vias 214 protrude out of the back surface of the recessed substrate 212. Next, a dielectric material such as silicon oxide, silicon nitride, or the like is filled into the recess, followed by a polishing process to remove excess portions of the dielectric layer, leaving dielectric layer 226 in the recess. Throughout the description, dielectric layer 216 is considered as a part of device die 210.

Through-vias 225 (which are through-dielectric vias) are also formed to penetrate through gap-filling regions 220. The corresponding process is illustrated as process 606 in the process flow 600 as shown in FIG. 35. In accordance with some embodiments, the formation process may include etching gap-filling regions 220 to form through-openings that penetrate through gap-filling regions 220. A conductive material such as titanium nitride, copper, tungsten, or the like, or multi-layers thereof is then filled into the through-openings. A planarization process such as a CMP process or a mechanical polishing process is then performed to remove excess portions of the conductive material, leaving through-vias 225 in the through-openings.

FIG. 2 also illustrates the formation of backside interconnect structure 230 on the backside of device die 210. The corresponding process is illustrated as process 608 in the process flow 600 as shown in FIG. 35. One or a plurality of dielectric layers 224 are deposited over device die 210 and gap-filling regions 220. Dielectric layers 224 may also be formed of inorganic materials such as silicon oxide, silicon nitride, silicon oxynitride, silicon oxycarbide, low-k materials, or the like, or organic materials such as polyimide, polybenzoxazole (PBO), or the like. The backside interconnect structure 230 may include RDLs and bond pads 228 in the dielectric layers. Although a single-layer interconnect structure 230 is illustrated as an example, there may be one or a plurality of dielectric layers and corresponding RDLs/ metal pads 228 therein. Device dies 210, gap-filling regions 220, and interconnect structure 230 collectively form reconstructed wafer 232.

Figure 3:
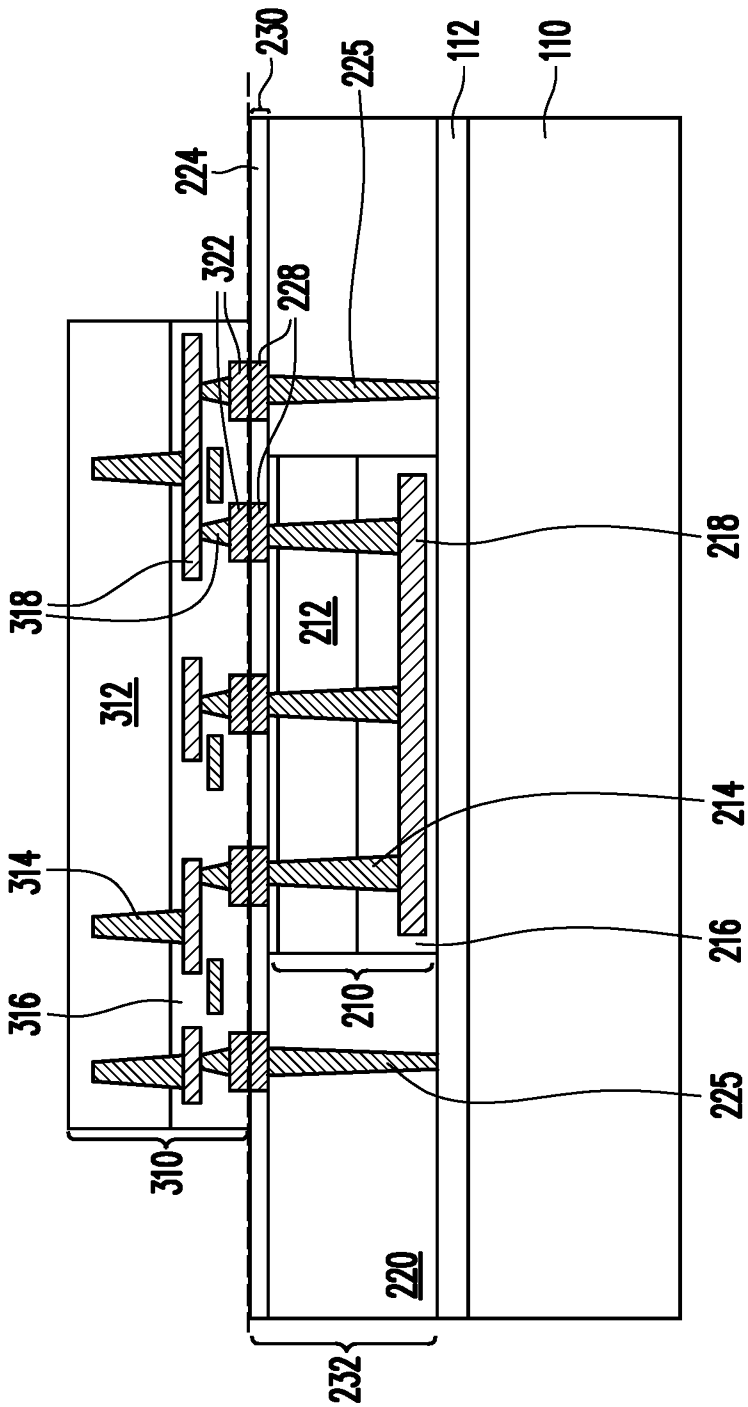

Referring to FIG. 3, tier-2 device die 310 is placed over and bonded to reconstructed wafer 232 through chip-on-wafer bonding. The corresponding process is illustrated as process 610 in the process flow 600 as shown in FIG. 35. The illustrated bonding scheme is also a face-to-back bonding, while other bonding scheme such as face-to-face bonding or back-to-back bonding may be adopted. The bonding may be at wafer level. Accordingly, a plurality of device dies 310 identical to each other are bonded to reconstructed wafer 232, although one device die 310 is illustrated. Device die 310 includes substrate 312. In accordance with some embodiments, device die 310 includes an active circuit at the illustrated bottom surface of semiconductor substrate 312. Through-vias 314 may be formed to extend into an intermediate level between a top surface and the bottom surface of substrate 312. Conductive features 318 are formed in dielectric layers 316 to connect to the active circuit.

Device die 310 is bonded to reconstructed wafer 232 through hybrid bonding, which includes direct metal-to-metal bonding and fusion bonding. For example, a bottom dielectric layer in device die 310 is bonded to a top dielectric layer 224 through fusion bonding, and bond pads 322 in device die 310 is bonded to bond pads 228 through direct metal-to-metal bonding.

Figure 4:
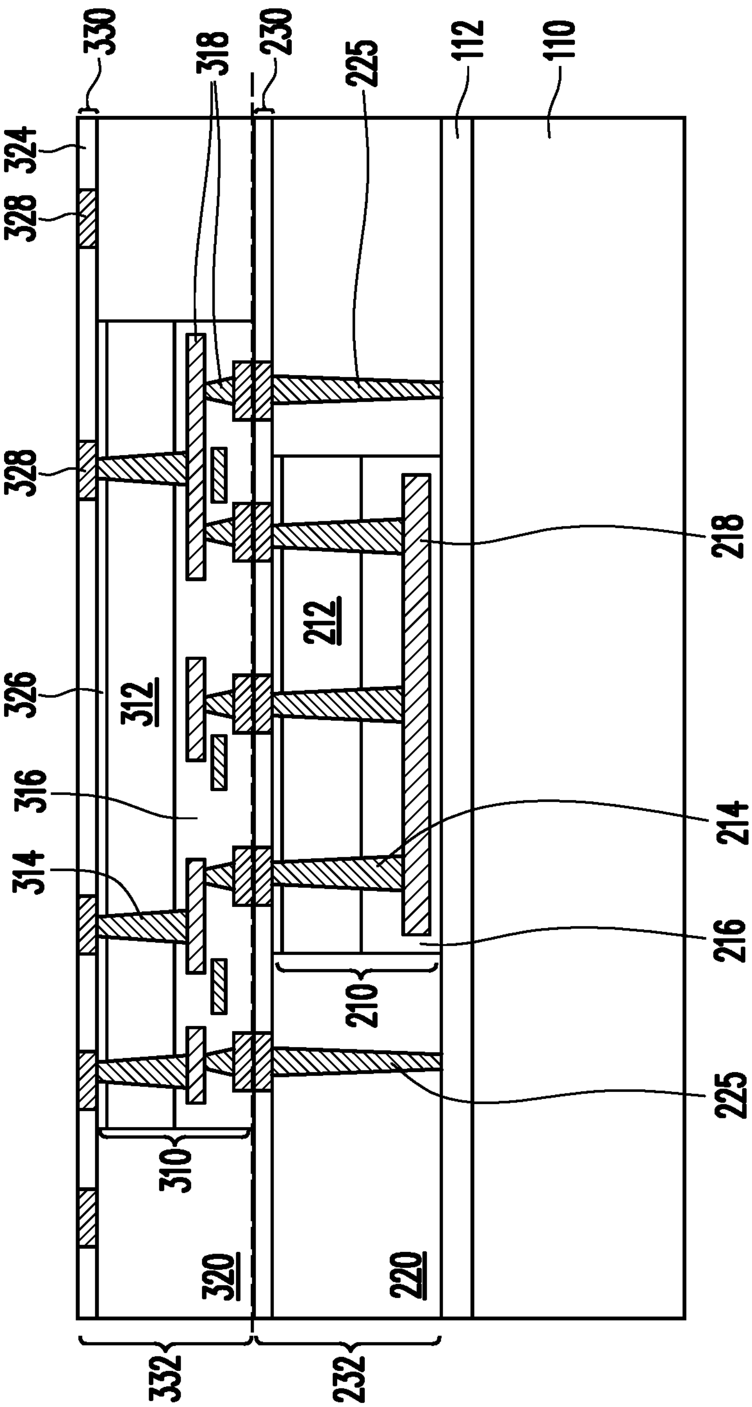

FIG. 4 illustrates the gap-filling of device dies 310. The corresponding process is illustrated as process 612 in the process flow 600 as shown in FIG. 35. The materials and the formation process may be selected from the corresponding candidate materials and the candidate formation processes of gap-filling regions 220, and the details are not repeated herein. A planarization process such as a CMP process or a mechanical grinding process is performed to level the back surface (the illustrated top surface) of device dies 310 with the top surface of gap-filling regions 320. The planarization process is stopped after through-vias 314 are exposed.

In a subsequent process, an etching process is performed to recess the back surface of substrate 312. Dielectric layer 226 is formed in the recess to encircle the top end portions of through-vias 314. Backside interconnect structure 330 is then formed on the backside of device die 210. The corresponding process is illustrated as process 614 in the process flow 600 as shown in FIG. 35. Backside interconnect structure 330 may include one or a plurality of dielectric layers 324, which may be formed of silicon oxide, silicon nitride, silicon oxynitride, silicon oxycarbide, polyimide, PBO, or the like. RDLs/bond pads 328 are formed in the dielectric layers 324. Throughout the description, device dies 310, gap-filling regions 320, and interconnect structure 330 collectively form reconstructed wafer 332.

Figure 5:
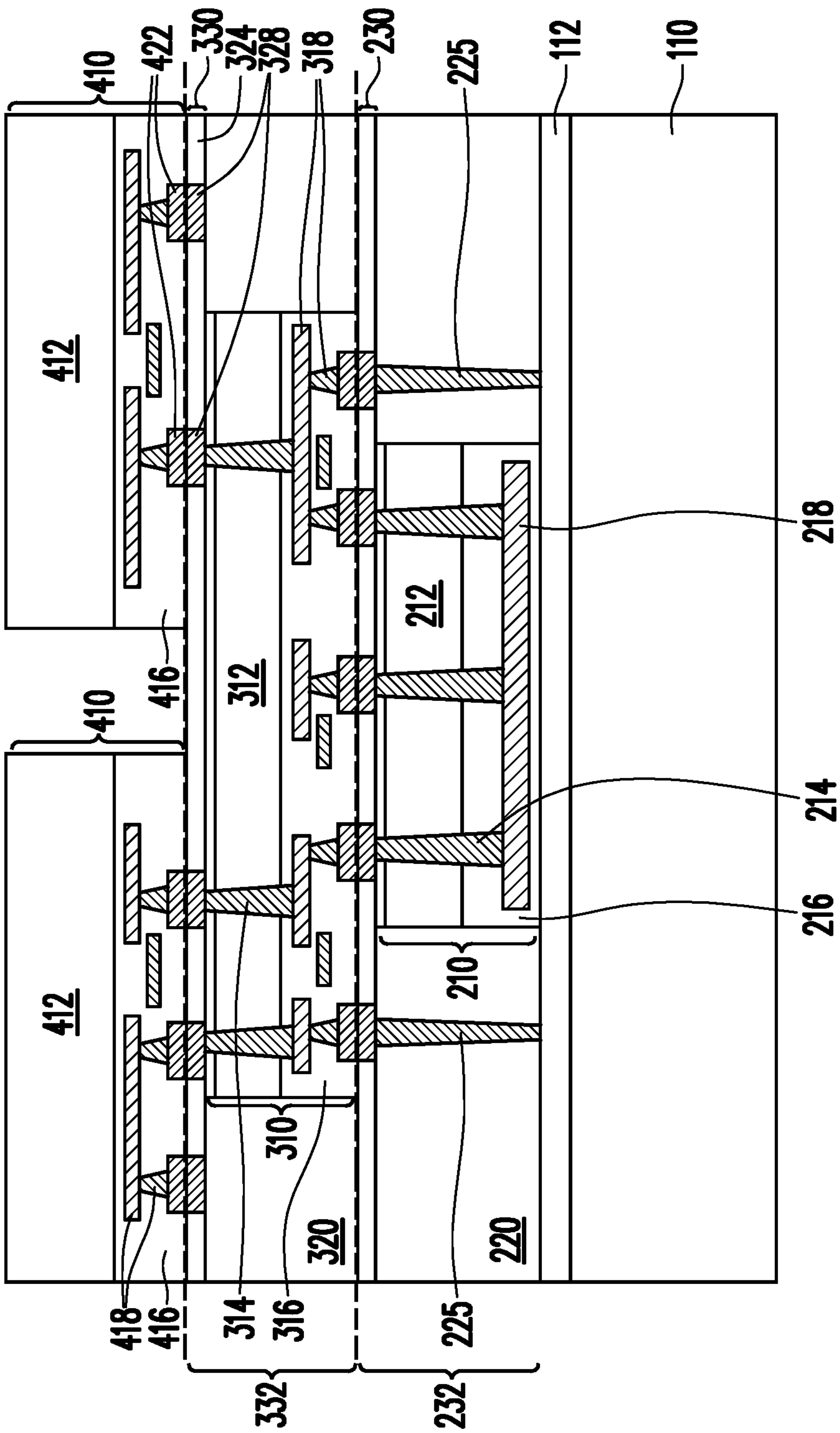

Referring to FIG. 5, tier-3 devices die 410 are placed over and bonded to reconstructed wafer 332 through chip-on-wafer bonding. The corresponding process is illustrated as process 616 in the process flow 600 as shown in FIG. 35. The illustrated bonding scheme is also a face-to-back bonding, while other bonding schemes such as face-to-face bonding or back-to-back bonding may be adopted. The bonding may be at wafer level. Accordingly, a plurality of groups of device dies 410 are bonded to reconstructed wafer 332, although one group of device die 410 is illustrated. Some of device dies 410 may be identical to each other, and may be identical to or different from other device dies 410. Device die 410 includes semiconductor substrate 412. In accordance with some embodiments, device die 410 includes an active circuit at a surface of semiconductor substrate 412. Conductive features 418 are formed to connect to the active circuit, and are formed in dielectric layers 416

Device dies 410 are bonded to reconstructed wafer 332 through hybrid bonding, which includes direct metal-to-metal bonding and fusion bonding. For example, a bottom dielectric layer in device die 410 is bonded to a top dielectric layer 324 through fusion bonding, and bond pads 422 in device die 410 is bonded to bond pads 328 through direct metal-to-metal bonding.

Figure 6:
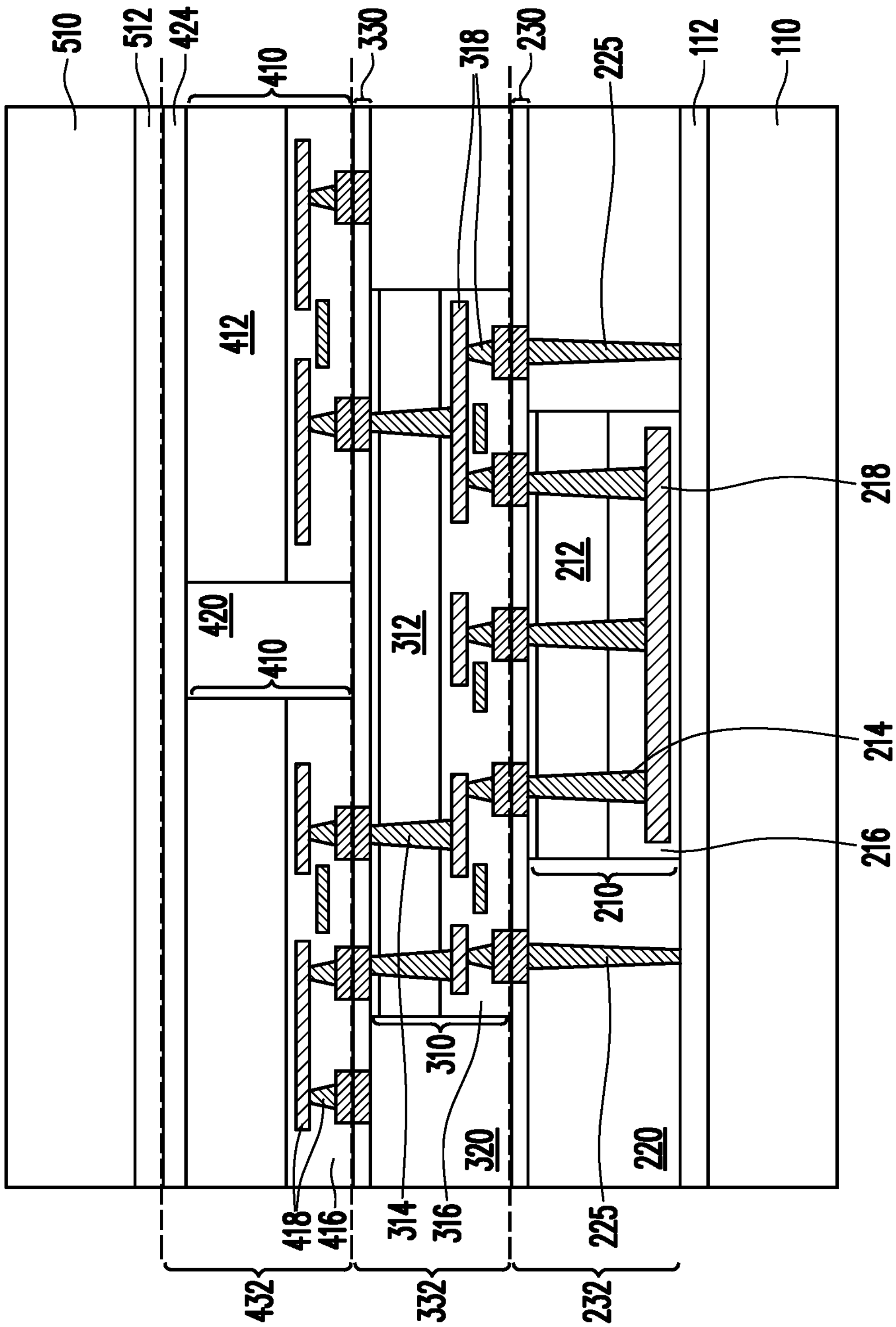

FIG. 6 illustrates the gap-filling of device dies 410. The corresponding process is illustrated as process 618 in the process flow 600 as shown in FIG. 35. The materials and the formation process may be selected from the corresponding candidate materials and the candidate formation processes of gap-filling regions 220, and the details are not discussed herein. A planarization process such as a CMP process or a mechanical grinding process is performed to level the back surface (the illustrated top surface) of device dies 410 with the top surface of gap-filling regions 420.

In a subsequent process, a bonding layer 424 is deposited on top of gap-filling regions 420 and device dies 410. The bonding layer 424 may be a silicon-containing dielectric layer, which may be formed of or comprise silicon oxide, silicon oxynitride, silicon oxy-carbo-nitride, or the like.

Figure 7:
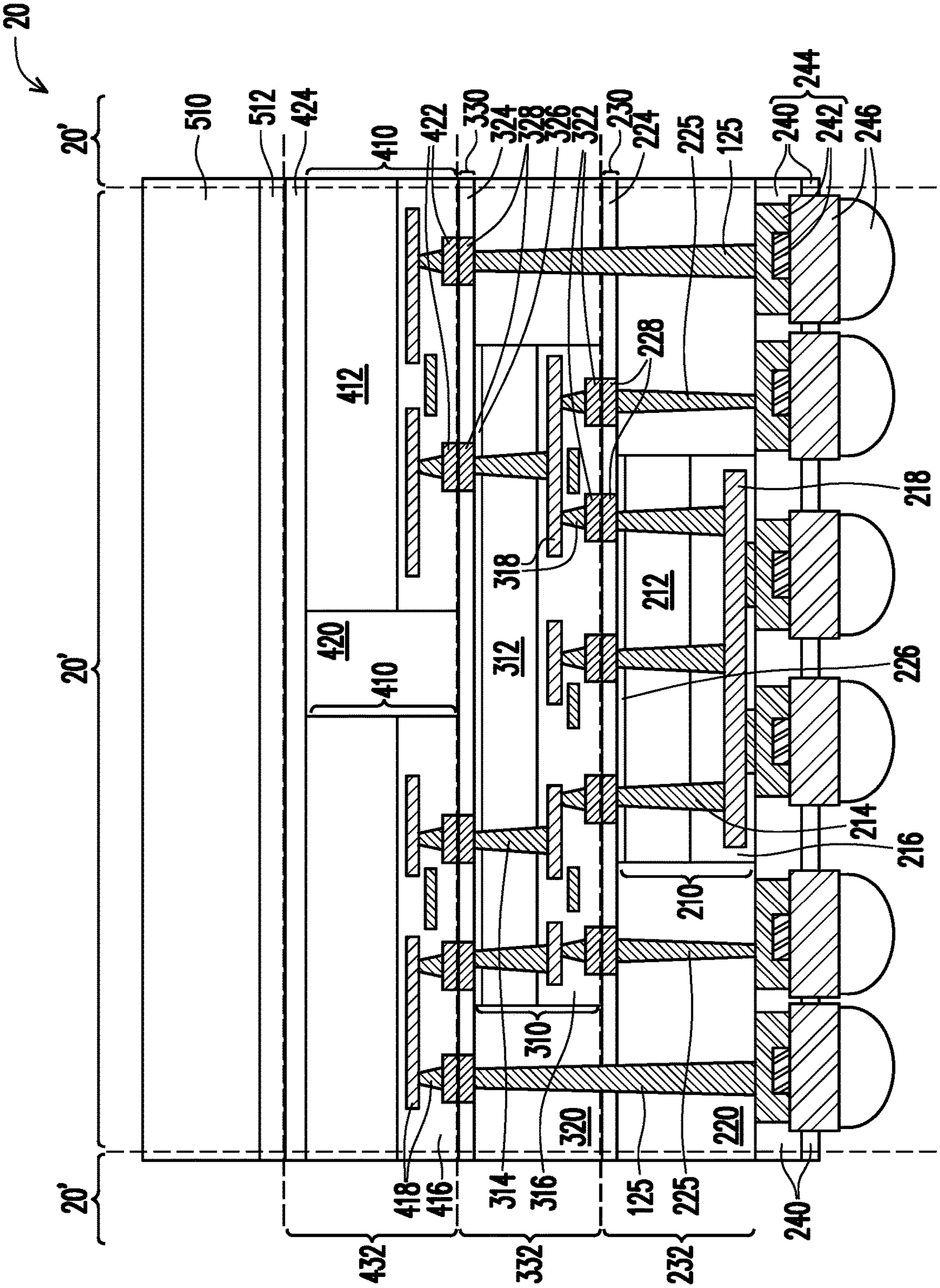

Next, a carrier swap process is performed, as shown in FIG. 7. The corresponding process is illustrated as process 620 in the process flow 600 as shown in FIG. 35. The carrier swap process includes attach carrier 510 onto reconstructed wafer 432. In accordance with some embodiments, carrier 510 is formed of or comprises a silicon carrier, and dielectric/bonding layer 512 is formed on carrier 510. Dielectric layer 512 may be formed of or comprises silicon oxide or another silicon-containing dielectric material. The bonding may thus be fusion bonding. In a subsequent process, carrier 110 is removed from reconstructed wafer 232. For example, when carrier 110 is formed of silicon, carrier 110 may be detached from reconstructed wafer 232 through laser lifting, or may be removed through grinding. When carrier 110 is a glass carrier and dielectric layer 112 comprises LTHC, the de-bonding may be performed by projecting a laser beam on the dielectric layer 112, so that layer is decomposed.

Further referring to FIG. 7, through-vias 125 (which are through-dielectric vias) are formed to penetrate through gap-filling regions 220, interconnect structure 230, and gap-filling regions 320. The corresponding process is illustrated as process 622 in the process flow 600 as shown in FIG. 35. In accordance with some embodiments, the formation process may include etching gap-filling regions 220, dielectric layer 224, and gap-filling regions 320 to form through-openings, through which bond pads 328 are exposed. A conductive material such as titanium nitride, copper, tungsten, or the like, or multi-layers thereof is then filled into the through-openings. A planarization process such as a CMP process or a mechanical polishing process is then performed to remove excess portions of the conductive material, leaving through-vias 125 in the through-openings. It is appreciated that by forming through-vias 125 directly penetrating through two tiers of gap-filling regions, the connection from device dies 410 to the subsequently formed interconnect structure 244 does not need to go through a plurality layers of RDLs and metal pads. The resistance of the electrical paths is thus smaller, and RC delay and voltage drop are reduced.

In accordance with alternative embodiments, instead of forming through-vias 125 that penetrate all the way through gap-filling regions 220, interconnect structure 230, and gap-filling regions 320, each of through-vias 125 is separated into a first through-via in gap-filling regions 220 and a second through-via penetrating through gap-filling regions 320. The first through-vias and the corresponding second through-vias are electrically interconnected through bond pads/RDLs 228 in interconnect structure 230.

After the formation of through-vias 125, interconnect structure 244 is formed, which includes dielectric layer(s) 240, and RDLs 242 in dielectric layers 240. Electrical connectors 246 are then formed at the bottom surface of interconnect structure 244, and are electrically connected to device die 210 and through-vias 125 and 225. The corresponding process is illustrated as process 624 in the process flow 600 as shown in FIG. 35.

The structure in FIG. 7 is collectively referred to as a reconstructed wafer 20. A singulation process may be performed to separate the reconstructed wafer 20 into a plurality of identical packages 20'. The corresponding process is illustrated as process 626 in the process flow 600 as shown in FIG. 35. In accordance with some embodiments, reconstructed wafer 20 is sawed apart without removing carrier 510, and the sawed pieces of carrier 510 are left in packages 20'. In accordance with alternative embodiments, carrier 510 is removed before the singulation process. Accordingly, the top surfaces of resulting packages 20' may be at the top surface level of dielectric layer 512, or at the level of the top surfaces of device dies 410 if dielectric layer 512 is removed.

As shown in FIG. 7, device die 310 extends laterally beyond the respective edges of the underlying device die 210. Accordingly, through-vias 225 may be overlapped by device die 310. Through-vias 225 directly connect bond pads 228 (and device die 310) to interconnect structure 244 without going through through-vias 214 and the metal lines and vias in device die 210. Through-vias 125 may also be formed to directly connect bond pads 328 (and device die 410) to interconnect structure 244 without going through through-vias 214 and 314 and the metal lines and vias in device dies 210 and 310. Accordingly, the resistance of the connection paths is reduced, and RC delay and voltage drop are reduced. In accordance with some embodiments, through-vias 125 and 225 may have greater lateral dimensions than the through-vias inside device dies, and hence may be used for providing power such as VDD and VSS, while the signal connection between different tiers of device dies may be provided through the through-vias inside device dies. For example, in accordance with some embodiments, all of the power connections from interconnect structure 244 to tier-2 device dies 310 and tier-3 device dies 410 may be through the through-dielectric vias such as 125 and 225, and all of the signal connections may be through the through-semiconductor vias such as 214 and 314.

Device die 310 is connected to two device dies 410. Accordingly, device dies 310 may be used as a bridge die, and provides lateral transmission of signal and/or power between device dies 410. The signal paths may include the metal lines and vias and bond pads in device dies 310 and 410. Also, the signal paths may include digital devices such as switches, routers, or the like, or all-metal connections including metal lines/pads and vias.

FIGS. 8 through 14 illustrate the formation of a package in accordance with alternative embodiments of the present disclosure. These embodiment are similar to the embodiment shown in FIGS. 1 through 7, except that two or more tier-2 device dies 310 are bonded to one tier-1 device die 210, and one tier-3 device die 410 may be bonded to two tier-2 device die 310. Unless specified otherwise, the materials and the formation processes of the components in these embodiments (and the embodiments shown in FIGS. 15 through 32) are essentially the same as the like components, which are denoted by like reference numerals in the preceding embodiments shown in FIGS. 1 through 7. The details regarding the formation process and the materials of the components shown in FIGS. 8 through 32 may thus be found in the discussion of the preceding embodiments.

Figure 8:
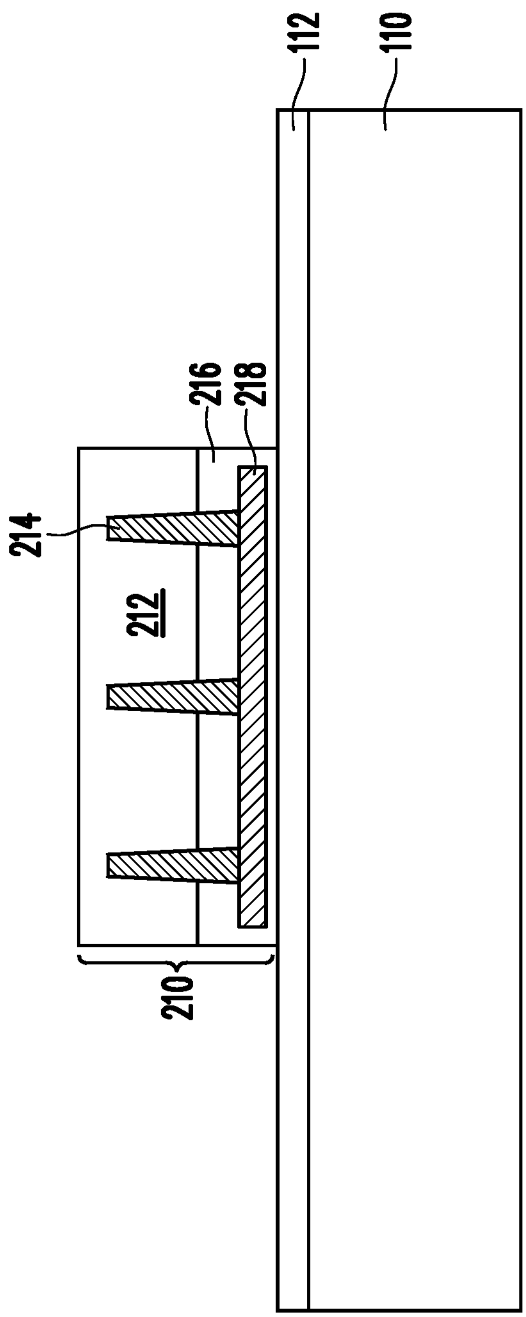
FIGS. 8 through 14 illustrate the cross-sectional views of intermediate stages in the formation of a package in accordance with some embodiments.
Figure 9:
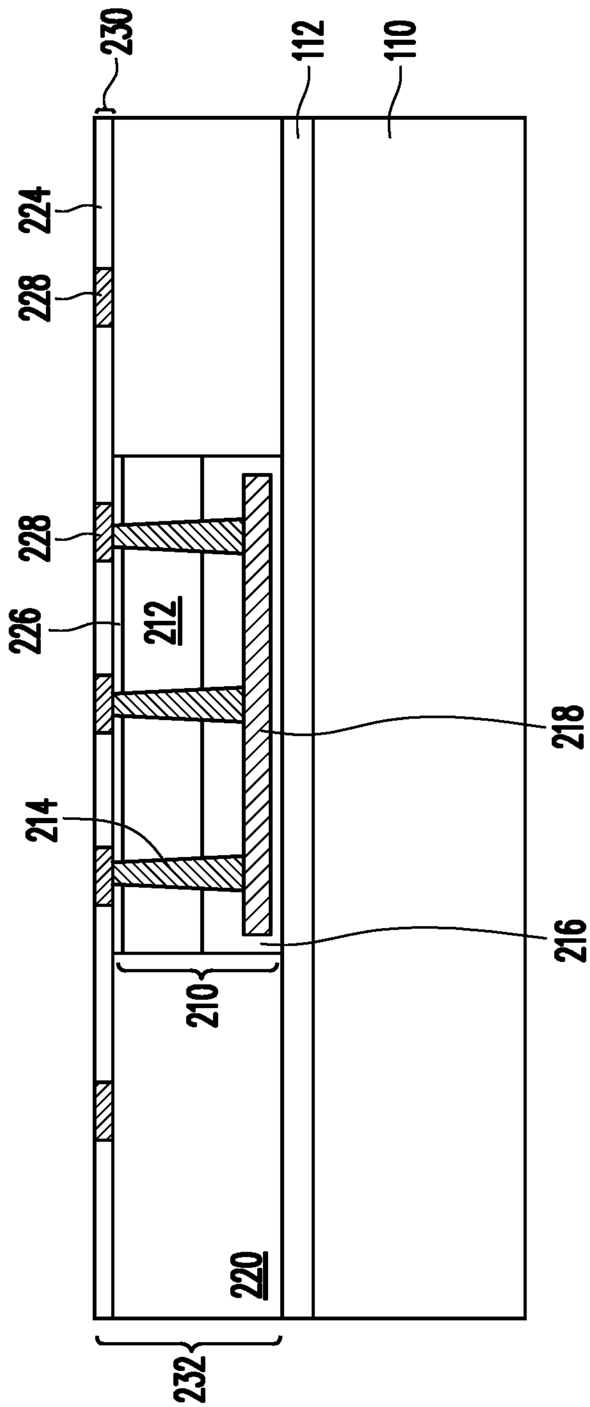

Referring to FIG. 8, tier-1 device die 210 is attached to carrier 110, for example, through fusion bonding or through an adhesive. Next, as shown in FIG. 9, gap-filling regions 220 are formed to encapsulate device die 210. A planarization process is then performed to level the top surface of device die 210, the top surfaces of through-vias 214, and the top surfaces of gap-filling regions 220. In accordance with some embodiments, different from the embodiments as shown in FIG. 2, no through-vias are formed in gap-filling regions 220 at this stage. In accordance with alternative embodiments, same as in FIG. 2, through-vias 225 may also be formed at this stage to penetrate through gap-filling regions 220. Dielectric layer 226 is then formed by recessing semiconductor substrate 212, and filling a dielectric material into the resulting recess. Next, interconnect structure 230, which includes dielectric layers 224 and bond pads/RDLs 228, is formed over gap-filling regions 220 and device die 210. Reconstructed wafer 232 is thus formed.

Figure 10:
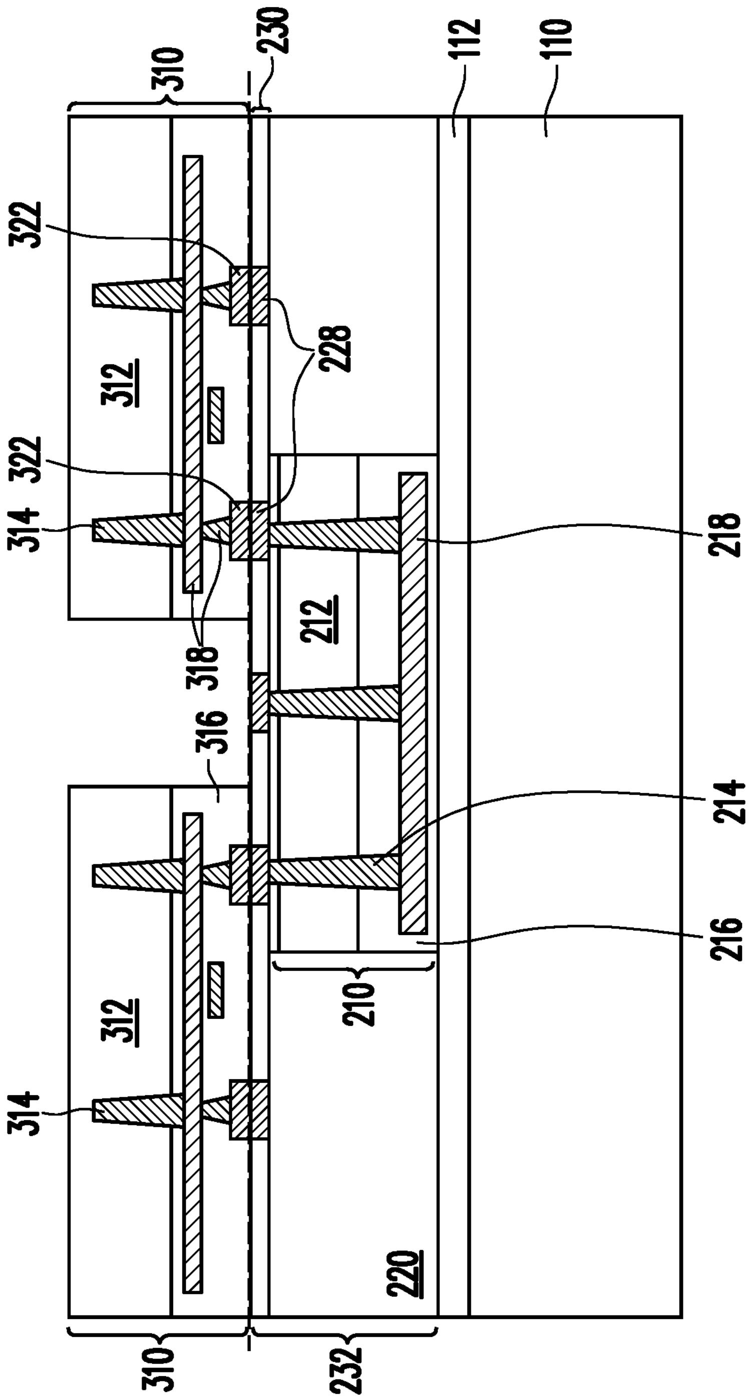

Referring to FIG. 10, tier-2 device dies 310 are bonded to reconstructed wafer 232, for example, through hybrid bonding. The bonding may also be face-to-back bonding, while other bonding schemes may also be adopted. In accordance with some embodiments, two or more device dies 310 are bonded to the same device die 210. Accordingly, device die 210 may also act as a bridge die (in addition to its other functions) to provide lateral connections between device dies 310. One or more of device dies 310 may extend laterally beyond the corresponding edges of device die 210, with some bond pads 322 of device dies 310 also vertically offset from device die 210.

Figure 11:
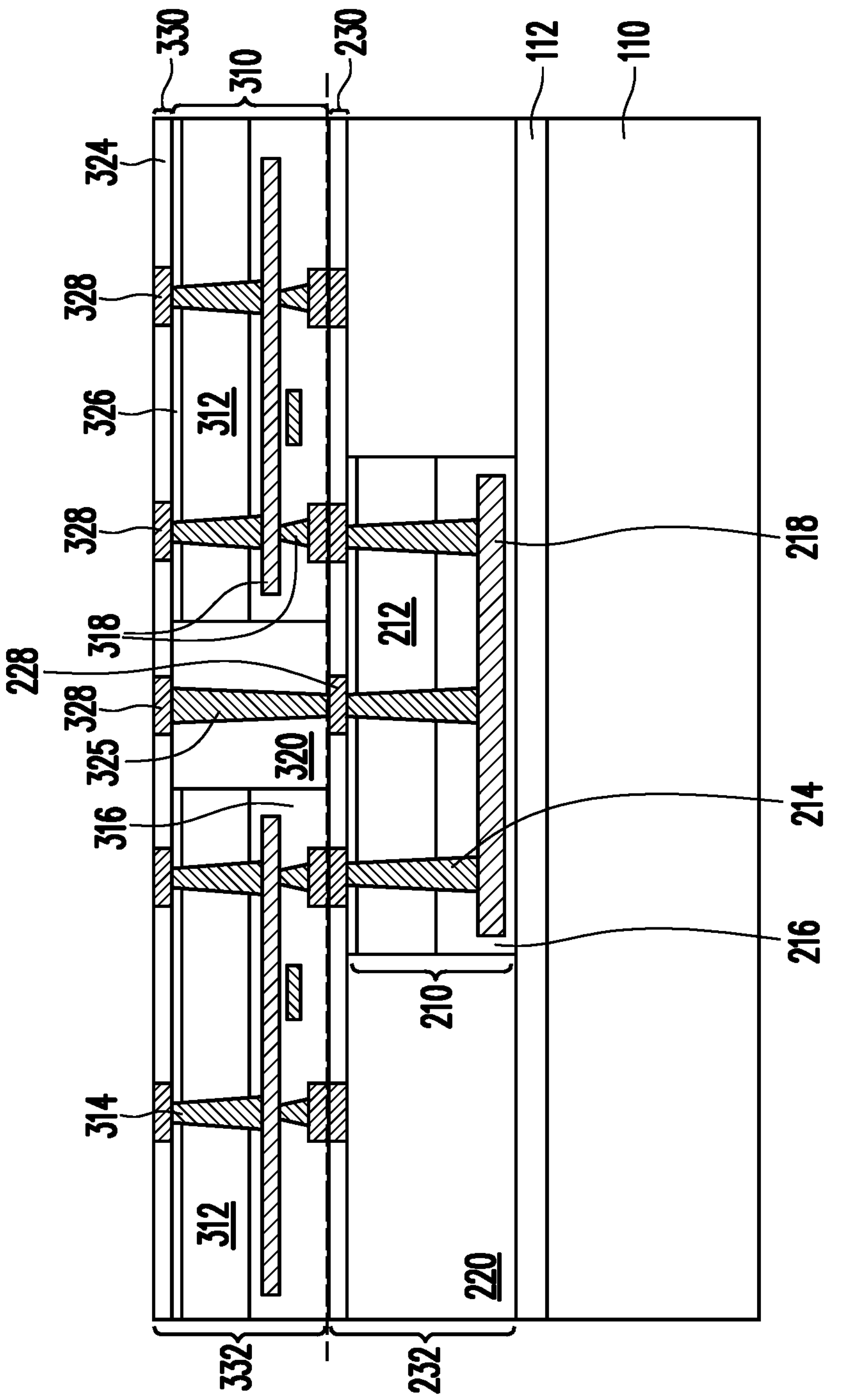

Next, as shown in FIG. 11, gap-filling regions 320 are formed, and are then planarized, so that their back surfaces are coplanar with the back surfaces of substrates 312. Through-vias 325 (which are through-dielectric vias) are then formed to penetrate through gap-filling regions 320, and connect to bond pads 228. Dielectric layers 316 are also formed to encircle the top end-portions of through-vias 314. Interconnect structure 330 is then formed, which includes dielectric layer(s) 324 and RDLs/bond pads 328. Reconstructed wafer 332 is thus formed.

Figure 12:
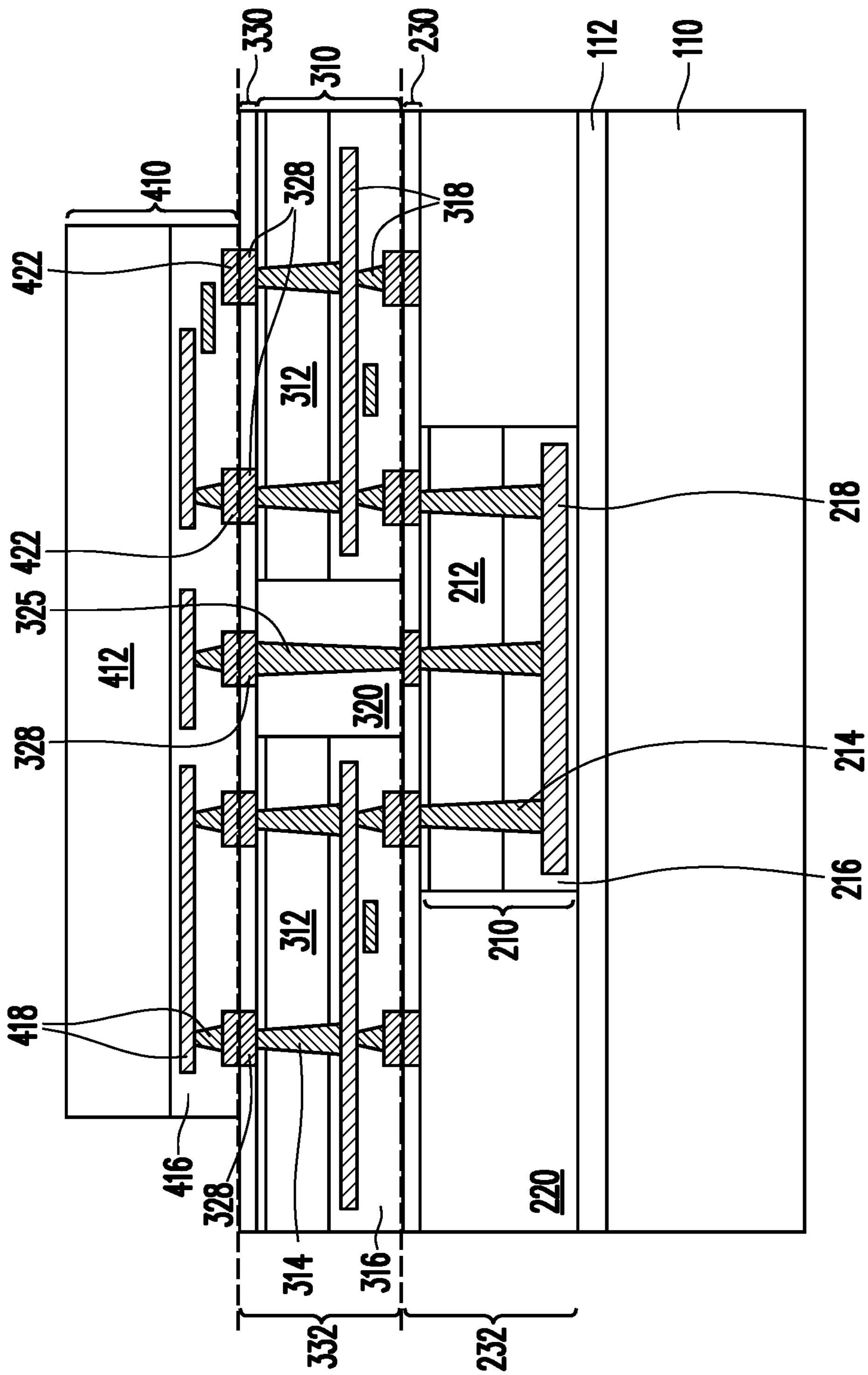

FIG. 12 illustrates the bonding of tier-3 device die 410, which is bonded to two device dies 310. Accordingly, device die 410 may also be used as a bridge die to interconnect two device dies 310 in accordance with some embodiments. Device die 410 is electrically connected to device die 210 through through-via 325, without going through any through-semiconductor vias in device dies 310.

Figure 13:
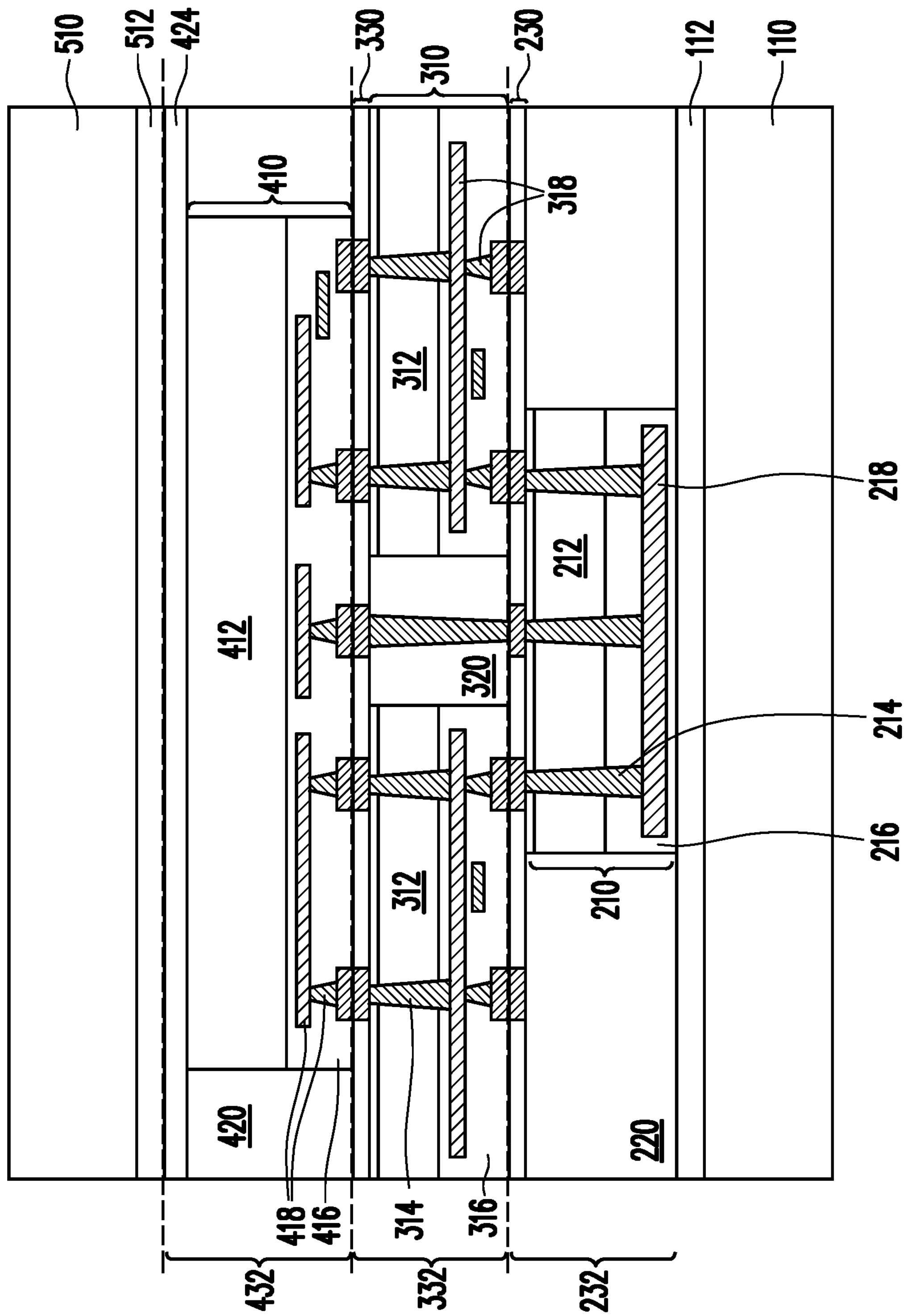

FIG. 13 illustrates the encapsulation of device die 410 in gap-filling regions 420, and the formation of bonding layer 424. Reconstructed wafer 432 is thus formed. Next, carrier 510 is attached to or bonded to reconstructed wafer 432, for example, through fusion bonding, with dielectric layer 512 on the surface of carrier 510 bonded to bonding layer 424. Carrier 510 may be a silicon carrier, a glass wafer, or the like. Carrier 510, instead of bonding to reconstructed wafer 432 through fusion bonding, may also be attached to reconstructed wafer 432 through an adhesive.

Figure 14:
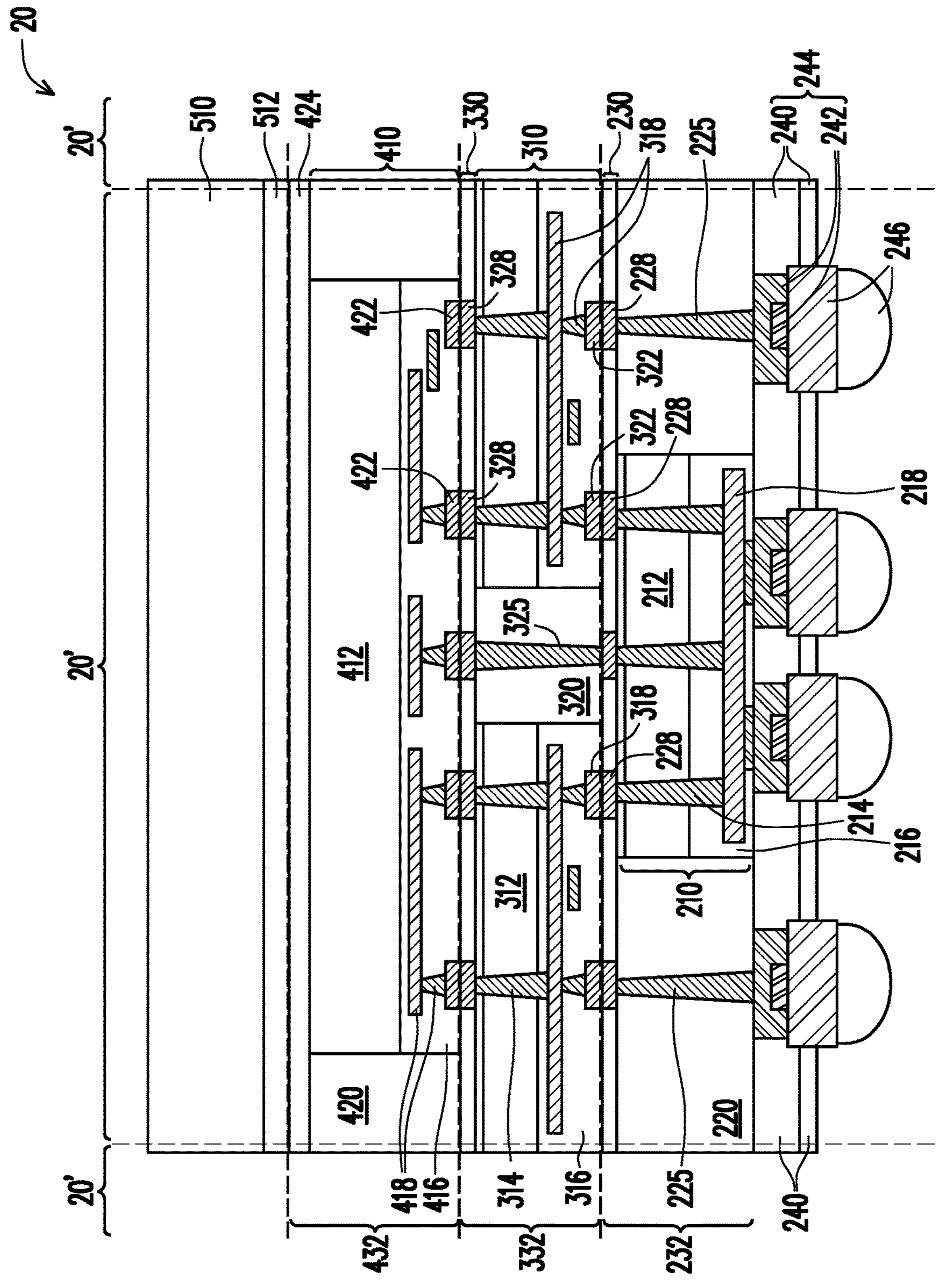

In a subsequent process, carrier 110 is de-bonded from reconstructed wafer 232, followed by the formation of through-vias 225. The resulting structure is shown in FIG. 14. Next, interconnect structure 244, which includes dielectric layers 240 and RDLs/bond pads 242, is formed. Electrical connectors 246 are also formed to electrically connect to through-vias 225 and device die 210 through interconnect structure 244. Reconstructed wafer 20 is thus formed.

In a subsequent process, reconstructed wafer 20 is singulated to form a plurality of identical packages 20'. Again, package 20' may or may not include the remaining pieces of carrier 510, and may or may not include the remaining pieces of bonding layers 424 and 512.

Figure 15:
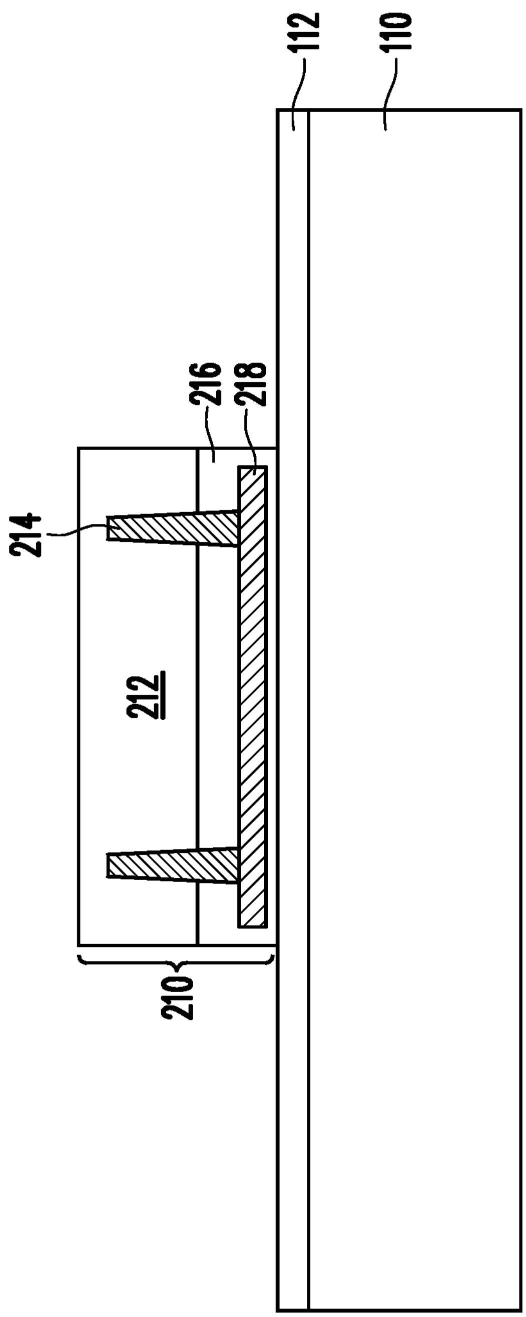
FIGS. 15 through 19 illustrate the cross-sectional views of intermediate stages in the formation of a package in accordance with some embodiments.
Figure 16:
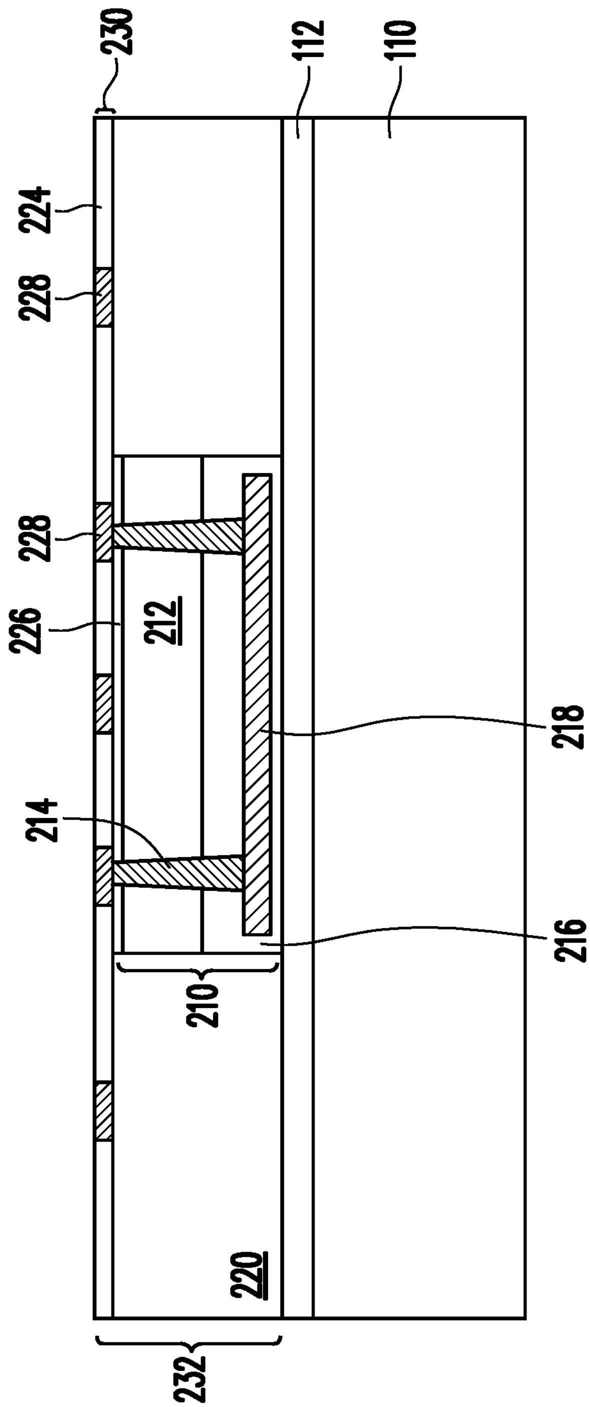

FIGS. 15 through 19 illustrate the formation of a package in accordance with alternative embodiments of the present disclosure. These embodiments are similar to the embodiment shown in FIGS. 1 through 14, except that there are two tiers (rather than three tiers) of device dies. Referring to FIG. 15, tier-1 device die 210 is attached to carrier 110. Next, as shown in FIG. 16, gap-filling regions 220 are formed to encapsulate device die 210, followed by the formation of dielectric layer 226. Interconnect structure 230 is then formed, which includes dielectric layer(s) 224 and bond pads/RDLs 228 therein. Reconstructed wafer 232 is thus formed.

Figure 17:
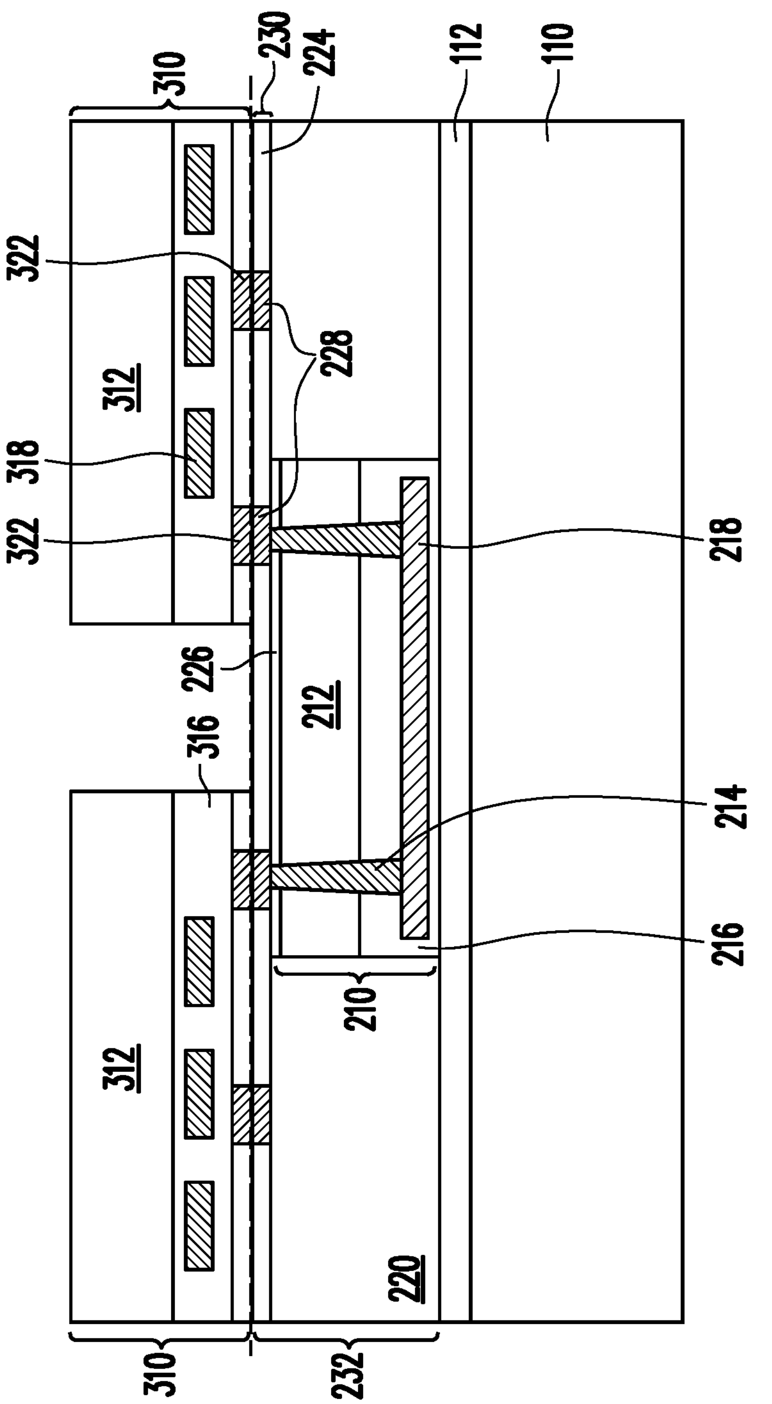

Referring to FIG. 17, tier-2 device dies 310 are bonded to reconstructed wafer 232, for example, through hybrid bonding. The bonding may be face-to-back bonding, while other bonding schemes may also be adopted. In accordance with some embodiments, two or more device dies 310 are bonded to the same device die 210. Accordingly, device die 210 may also act as a bridge die (in addition to its other functions) to provide lateral connection between device dies 310. One or more of device dies 310 may extend laterally beyond the corresponding edges of device die 210, with some bond pads 322 of device dies 310 also vertically offset from device die 210.

Figure 18:
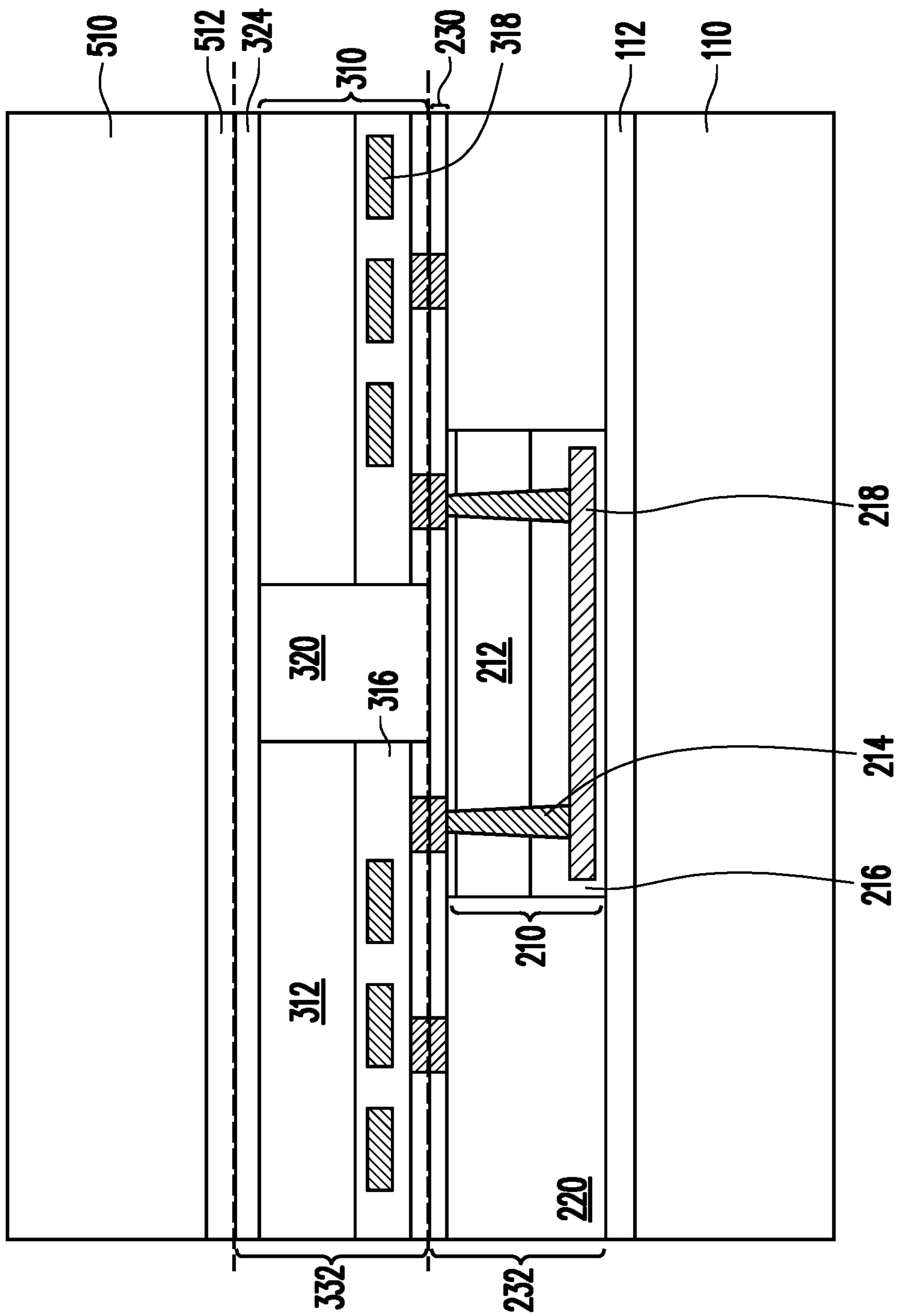

Next, as shown in FIG. 18, gap-filling regions 320 are formed, and then are planarized, so that their back surfaces are coplanar with the back surfaces of substrates 312. Gap-filling regions 320 encircles device dies 310 when viewed in the top view. Bonding layer 324, which is a dielectric layer, is then formed. Reconstructed wafer 332 is thus formed. Next, carrier 510 is attached to reconstructed wafer 332, for example, through fusion bonding, with dielectric layer 512 on the surface of carrier 510 bonded to bonding layer 324. Carrier 510 may be a silicon carrier or a glass wafer. Carrier 510, instead of bonding to reconstructed wafer 332 through fusion bonding, may also be attached to reconstructed wafer 332 through an adhesive.

Figure 19:
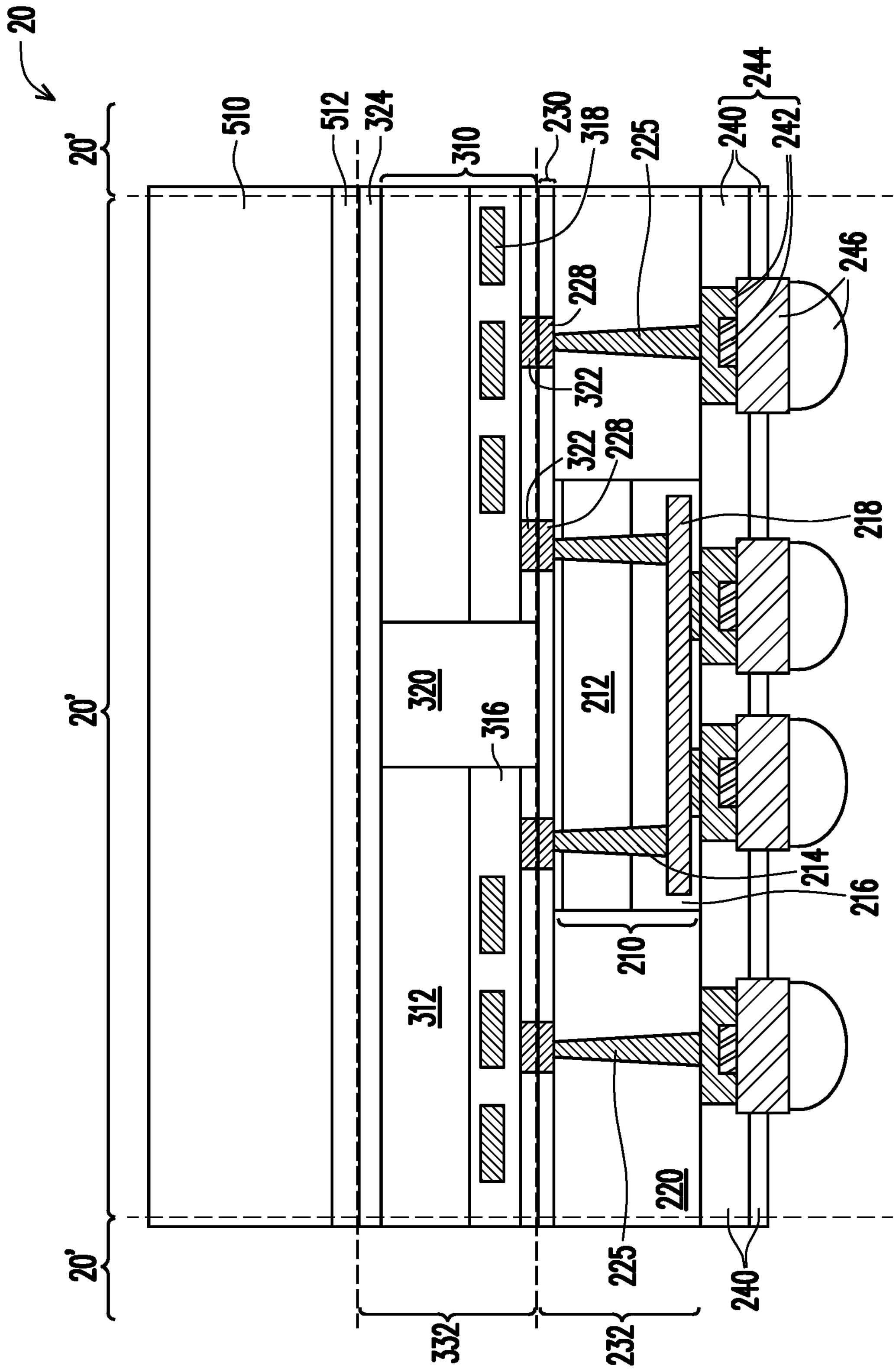

In a subsequent process, carrier 110 is de-bonded from reconstructed wafer 232, followed by the formation of through-vias 225. The resulting structure is shown in FIG. 19. Next, interconnect structure 244, which includes dielectric layers 240 and RDLs/bond pads 242, is formed. Electrical connectors 246 are also formed to electrically connect to through-vias 225 and device die 210 through interconnect structure 244. Reconstructed wafer 20 is thus formed.

In a subsequent process, reconstructed wafer 20 is singulated to form a plurality of identical packages 20'. Again, package 20' may or may not include the remaining pieces of carrier 510, and may or may not include the remaining pieces of dielectric layers 324 and 512.

Figure 20:
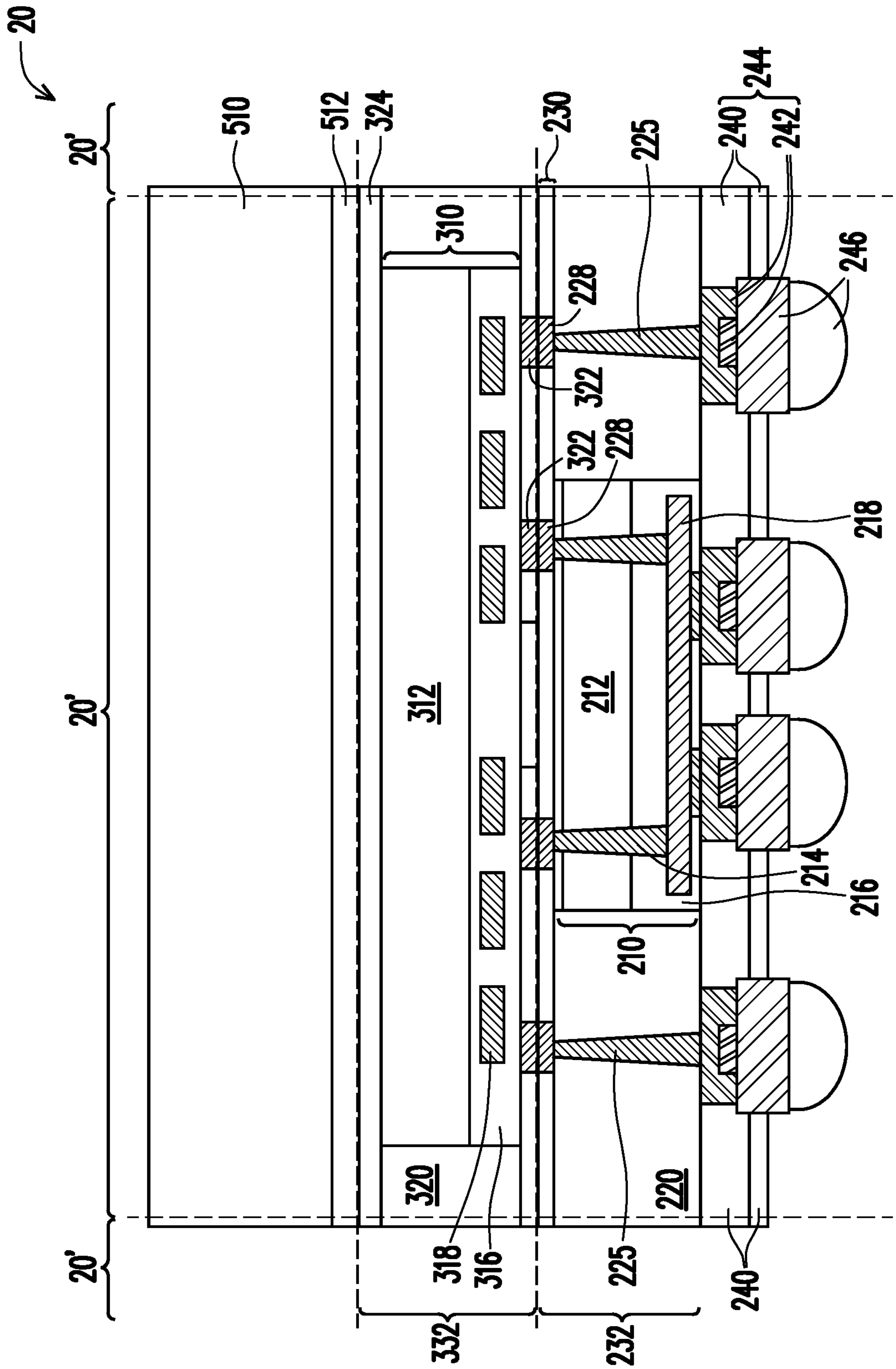
FIG. 20 illustrates a cross-sectional view of a package in accordance with some embodiments.

FIG. 20 illustrates a reconstructed wafer 20 and the corresponding packages 20' in accordance with alternative embodiments. These embodiments are similar to the embodiments as shown in FIG. 19, except that a single tier-2 device die 310 is bonded to device die 210. Again, device die 310 extends laterally beyond the edges of device die 210, so that through-vias 225 may be formed directly underlying device die 310, and interconnecting device die 310 and interconnect structure 244.

Figure 21:
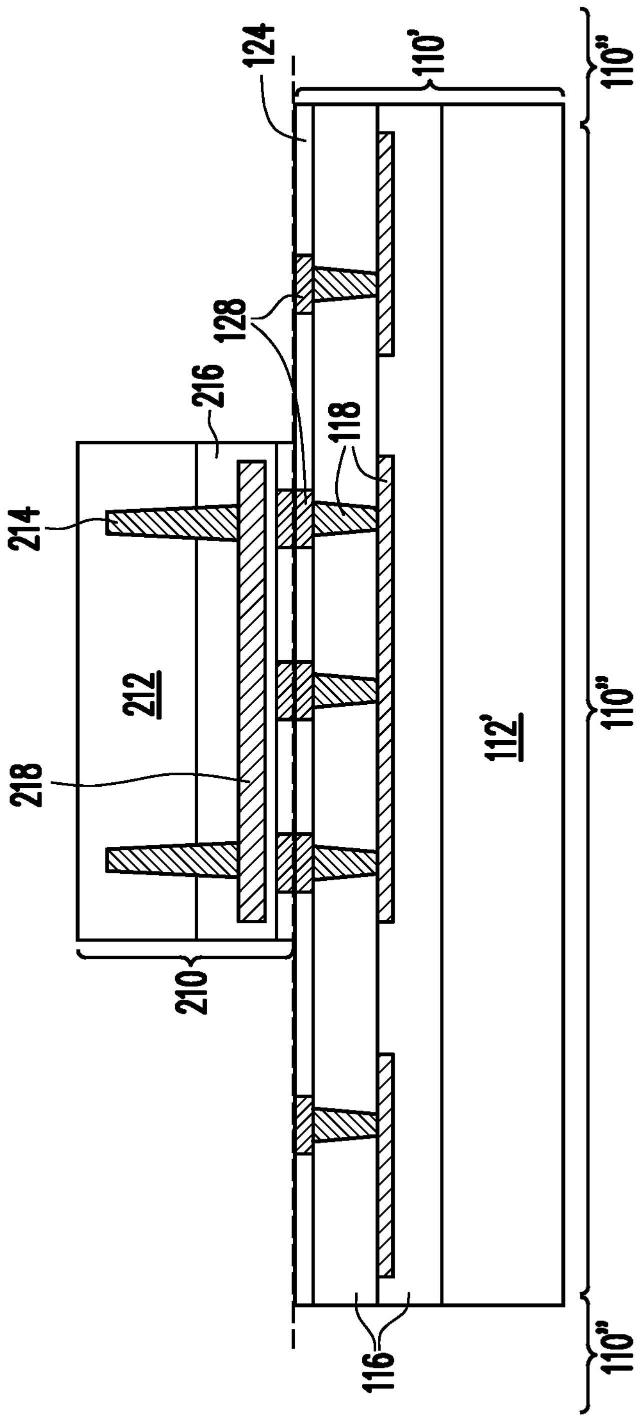
FIGS. 21 through 24 illustrate the cross-sectional views of intermediate stages in the formation of a package in accordance with some embodiments.

FIGS. 21 through 24 illustrate the formation of a package in accordance with alternative embodiments of the present disclosure. These embodiments are similar to the preceding embodiments, except that carrier 110 is replaced with a device wafer 110'. Referring to FIG. 21, tier-1 device die 210 is bonded to the device dies 110" in device wafer 110' through hybrid bonding. The bonding may also be a face-to-face bonding, while other bonding schemes may also be adopted. Device dies 110" also includes semiconductor substrate 112, and active circuits (not shown) at the top surface of semiconductor substrate 112. Furthermore, device dies 110" includes dielectric layers 116, conductive features 118, surface dielectric layer 124, and bond pads 128.

Figure 22:
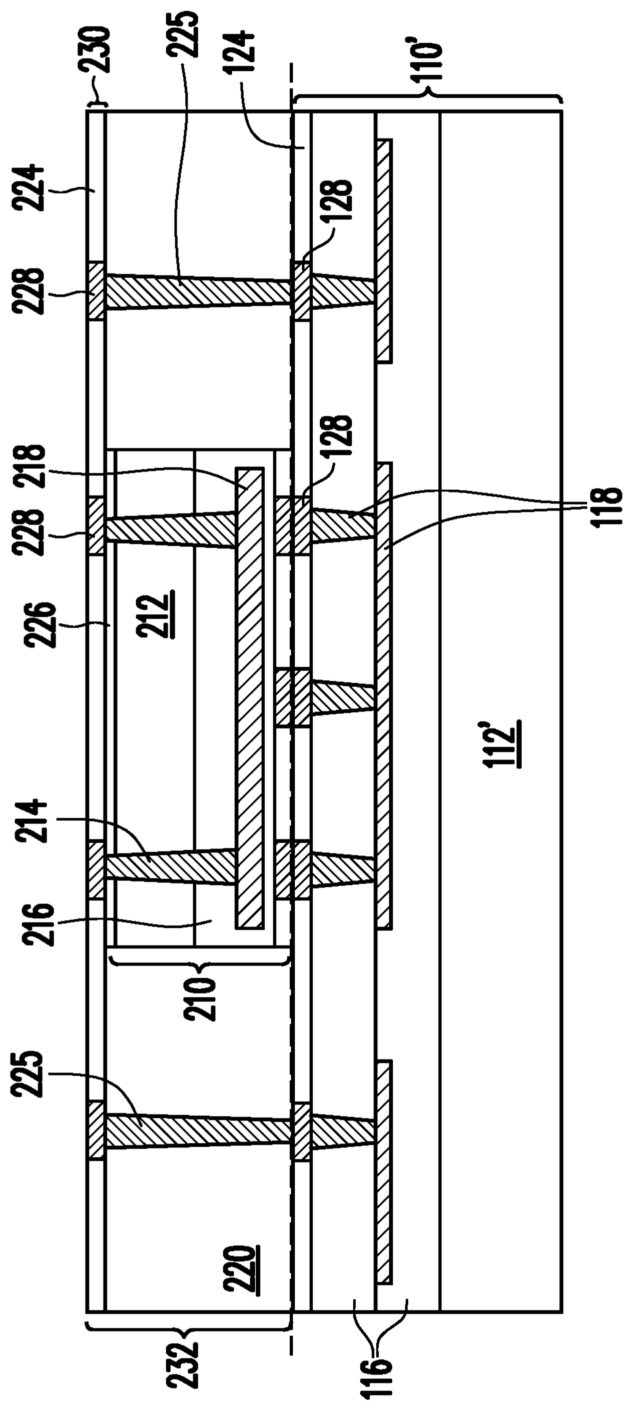

Next, as shown in FIG. 22, gap-filling regions 220 are formed to encapsulate device die 210, followed by the formation of dielectric layer 226. Through-vias 225 are also formed in gap-filling regions 220, and are electrically connected to bond pads 128. Interconnect structure 230 is then formed, which includes dielectric layers 224 and bond pads/RDLs 228 therein. Reconstructed wafer 232 is thus formed.

Next, as shown in FIG. 22, gap-filling regions 220 are formed to encapsulate device die 210, followed by the formation of dielectric layer 226. Through-vias 325 are also formed in gap-filling regions 220, and are electrically connected to bond pads 128. Interconnect structure 230 is then formed, which includes dielectric layers 224 and bond pads/RDLs 228 therein. Reconstructed wafer 232 is thus formed.

Figure 23:
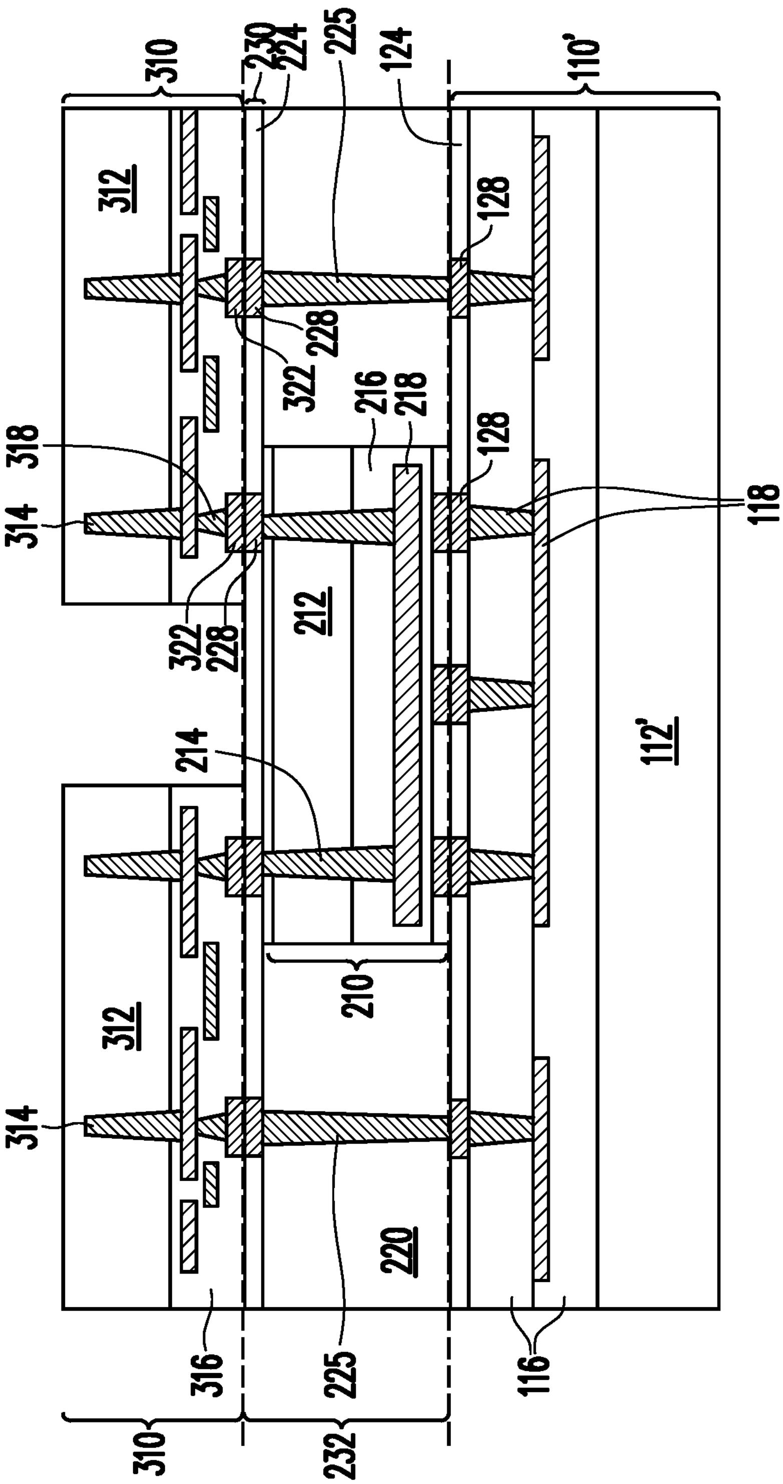

Referring to FIG. 23, tier-2 device dies 310 are bonded to reconstructed wafer 232, for example, through hybrid bonding. The bonding may be face-to-back bonding, while other bonding schemes may also be adopted. In accordance with some embodiments, two or more device dies 310 are bonded to the same device die 210. Accordingly, device die 210 may also act as a bridge die (in addition to its other functions) to provide lateral connection of device dies 310. One or more of device dies 310 may extend laterally beyond the corresponding edges of device die 210, with some bond pads 322 of device dies 310 also being vertically offset from device die 210.

Figure 24:
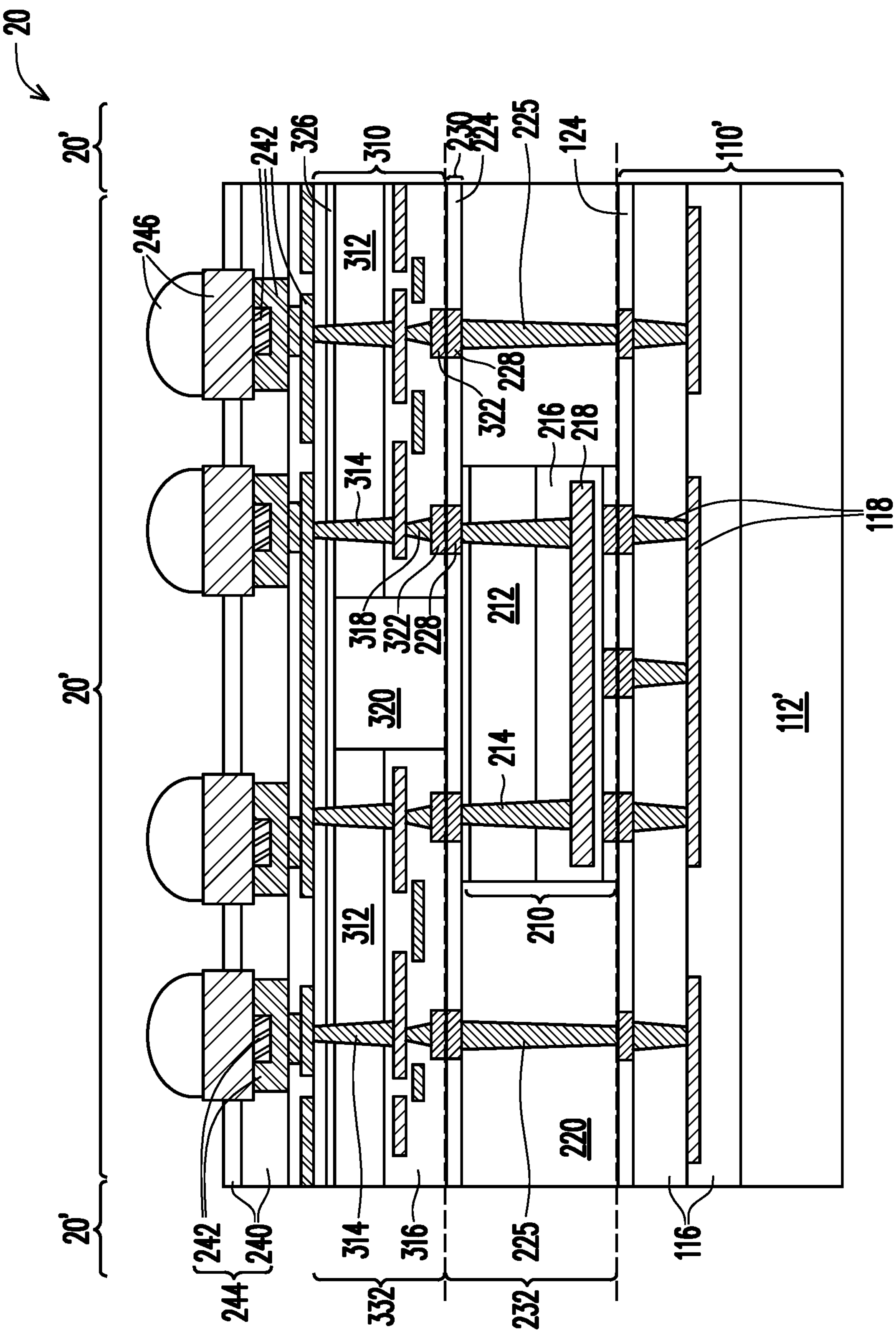

Next, as shown in FIG. 24, gap-filling regions 320 are formed to encapsulate device dies 310, and then are planarized, so that their back surfaces are coplanar with the back surfaces of substrates 312. Semiconductor substrates 312 and gap-filling regions 320 may be recessed, followed by the formation of dielectric layer(s) 326 to encircle the top end portions of through-vias 314 in device dies 310.

Next, interconnect structure 244, which includes dielectric layers 240 and RDLs/bond pads 242, is formed over and electrically connected to device dies 310. Electrical connectors 246 are also formed to electrically connect to device dies 310 through interconnect structure 244. Reconstructed wafer 20 is thus formed. In a subsequent process, reconstructed wafer 20 is singulated to form a plurality of identical packages 20'.

Figure 25:
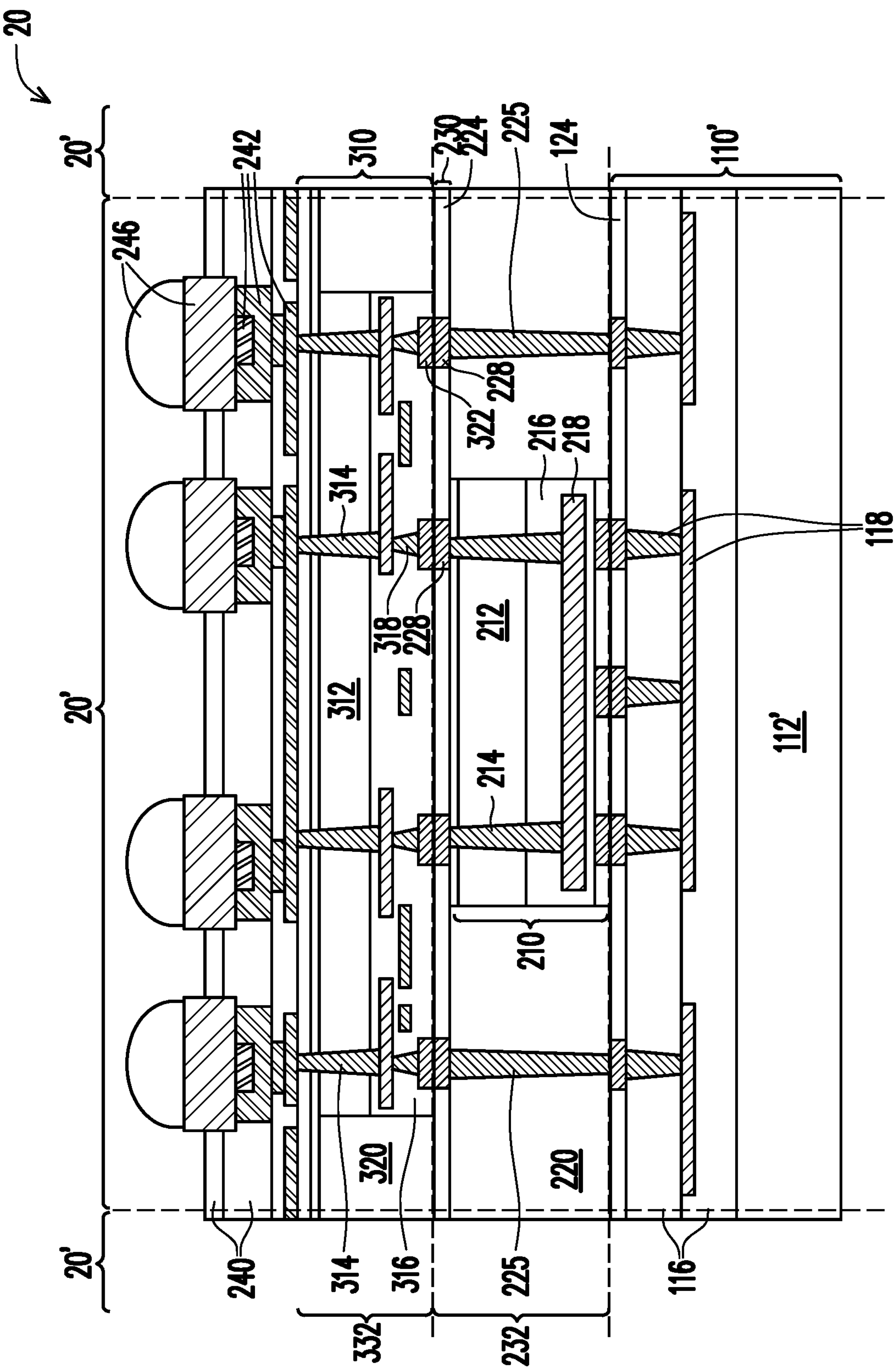
FIG. 25 illustrates a cross-sectional view of a package in accordance with some embodiments.

FIG. 25 illustrates a reconstructed wafer 20 and the corresponding packages 20' in accordance with alternative embodiments. These embodiments are similar to the embodiments as shown in FIG. 24, except that a single device die 310 is bonded to device die 210. Again, device die 310 extends laterally beyond the edges of device die 210, so that through-vias 225 may be formed directly underlying, and interconnecting device die 310 and interconnect structure 244.

Figure 26:
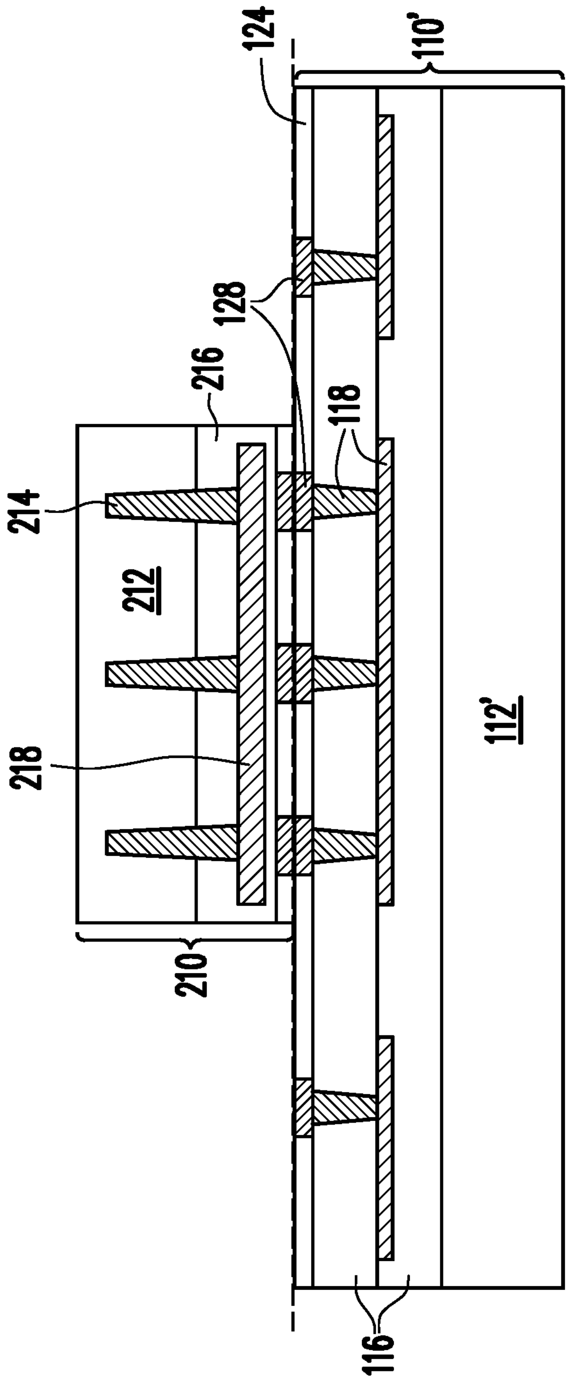
FIGS. 26 through 31 illustrate the cross-sectional views of intermediate stages in the formation of a package in accordance with some embodiments.

FIGS. 26 through 31 illustrate the formation of a package in accordance with alternative embodiments of the present disclosure. These embodiments are similar to the embodiments as shown in FIGS. 21-25 (with a device wafer used to replace carrier), except that three tiers of device dies are stacked over the bottom wafer 110'. Referring to FIG. 26, tier-2 device die 210 is stacked on the device dies 110" in device wafer 110' through hybrid bonding. The bonding may also be a face-to-face bonding, while other bonding schemes may also be adopted.

Figure 27:
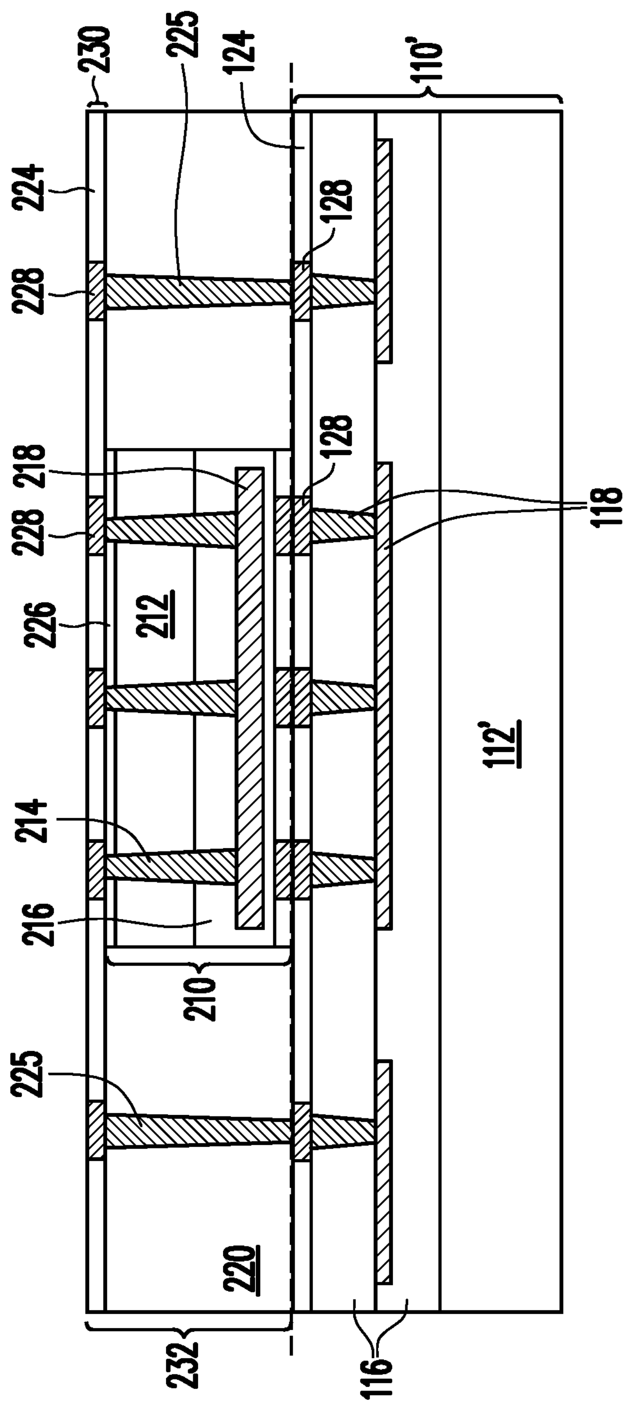
Figure 28:
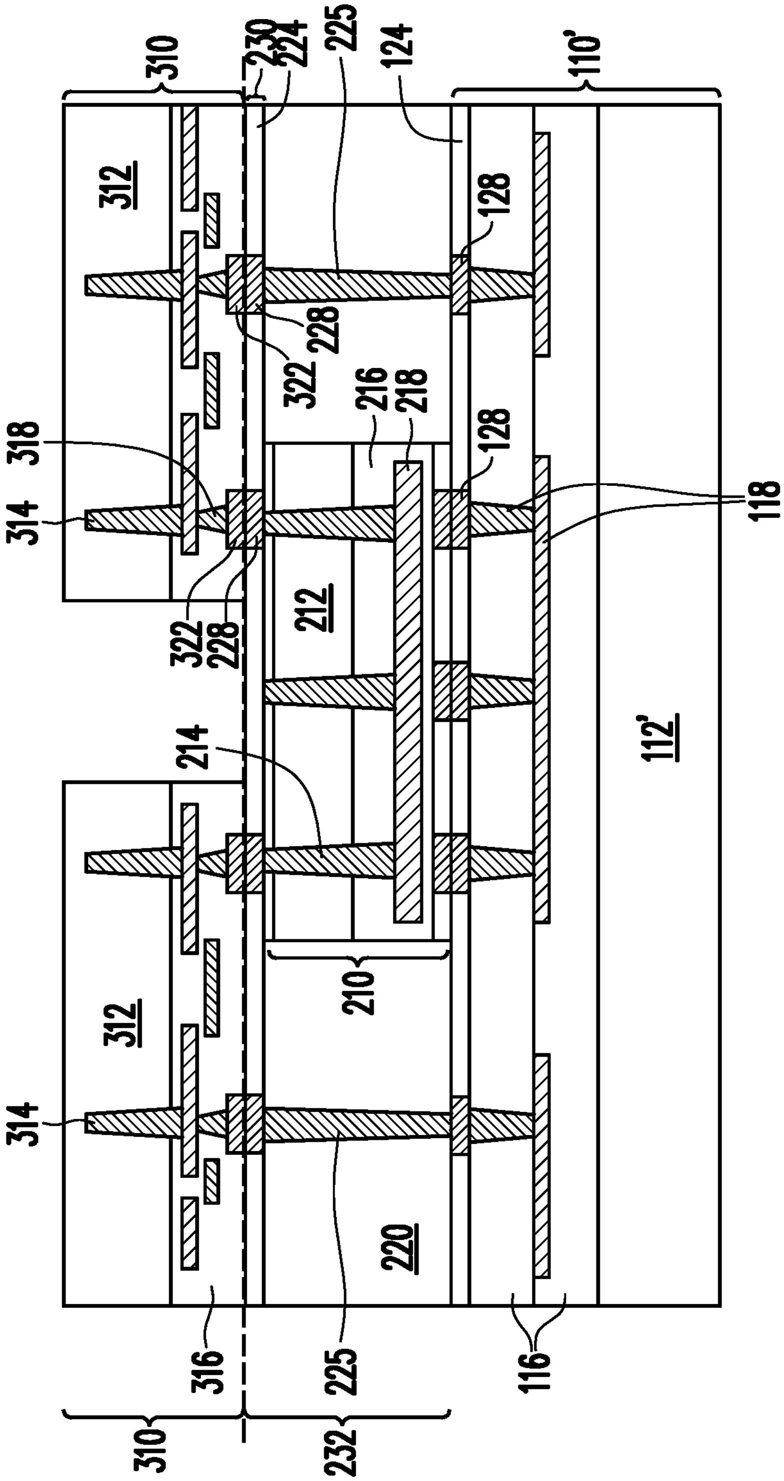

Next, as shown in FIG. 27, gap-filling regions 220 are formed to encapsulate device die 210, followed by the formation of dielectric layer 226. Through-vias 225 are also formed in gap-filling regions 220, and are electrically connected to bond pads 128. Interconnect structure 230 is then formed, which includes dielectric layers 224 and bond pads/RDLs 228 therein. Reconstructed wafer 232 is thus formed Referring to FIG. 28, tier-2 device dies 310 are bonded to reconstructed wafer 232, for example, through hybrid bonding. The bonding may also be face-to-back bonding, while other bonding schemes may also be adopted. In accordance with some embodiments, two or more device dies 310 are bonded to the same device die 210. Accordingly, device die 210 may also act as a bridge die (in addition to its other functions) to provide the lateral interconnection of device dies 310. One or more of device dies 310 may extend laterally beyond the corresponding edges of device die 210, with some bond pads 322 of device dies 310 also vertically offset from device die 210.

Figure 29:
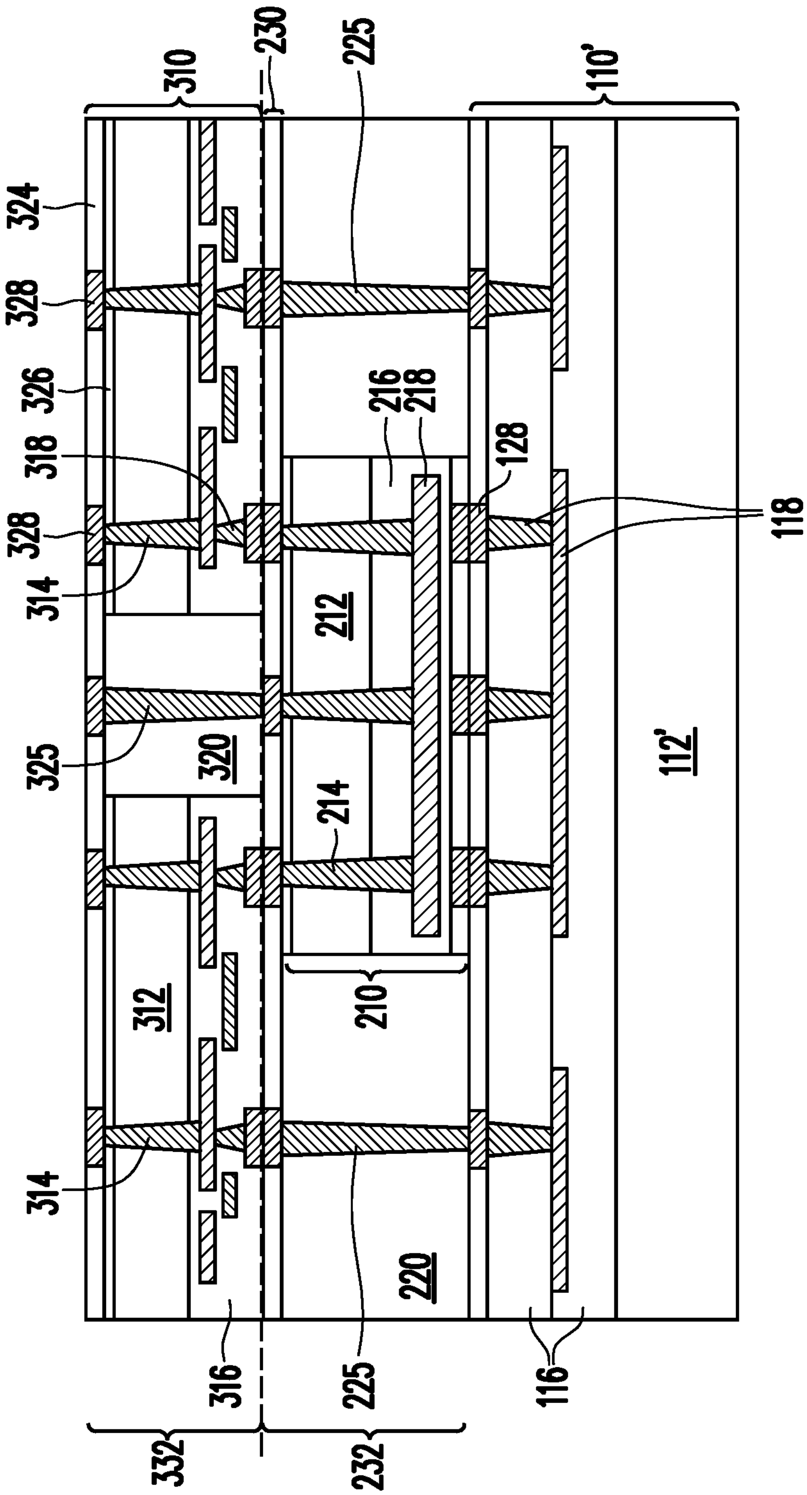

Next, as shown in FIG. 29, gap-filling regions 320 are formed, and then are planarized, so that their back surfaces are coplanar with the back surfaces of substrates 312. Through-vias 325 are formed in gap-filling regions 320. Semiconductor substrates 312 and gap-filling regions 320 may be recessed, followed by the formation of dielectric layers 326 to encircle the top end portions of through-vias 314 in device dies 310.

Figure 30:
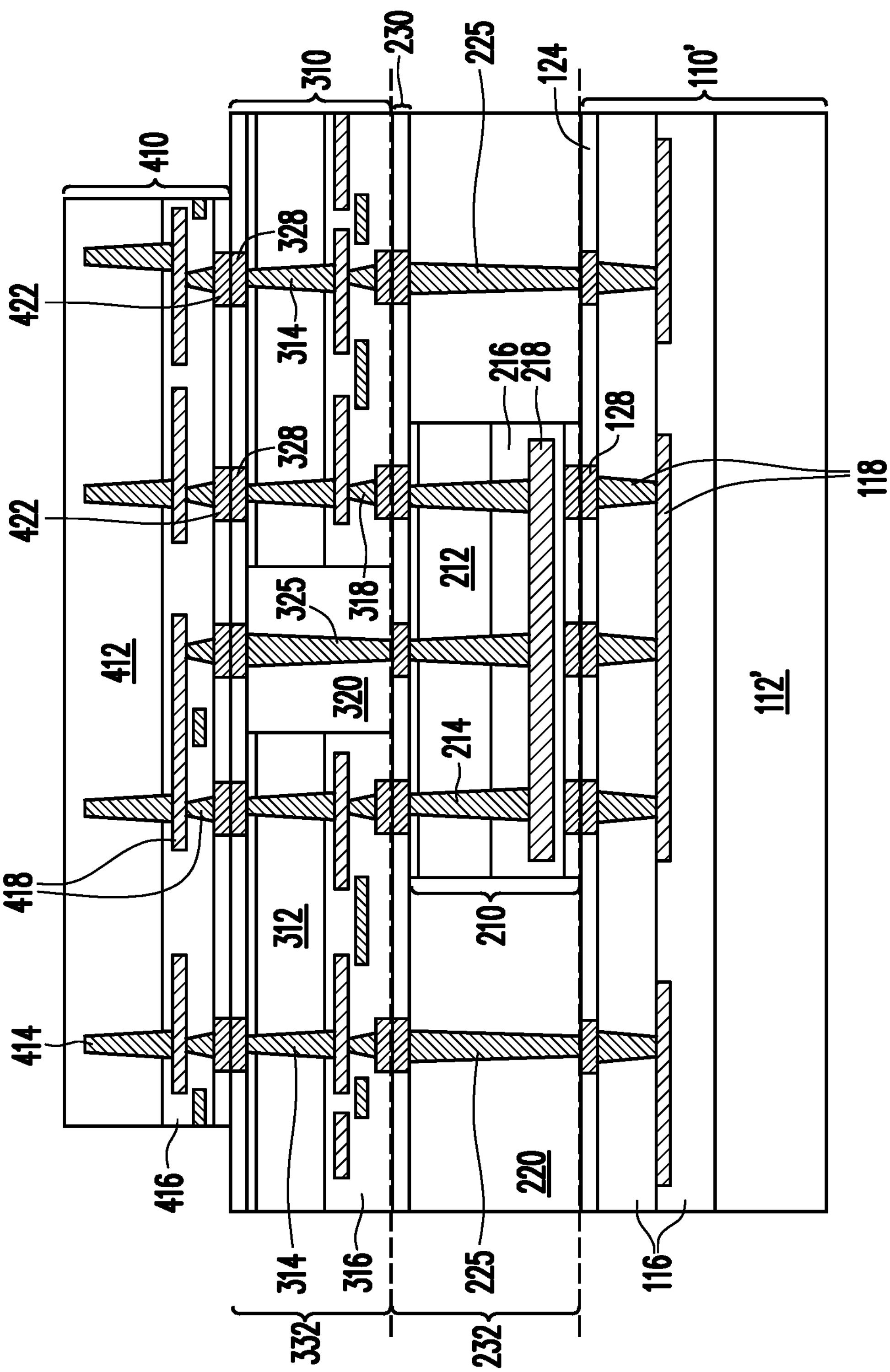

FIG. 30 illustrates the bonding of device die 410, which is bonded to two device dies 310. Accordingly, device die 410 may also be used as a bridge die to interconnect two device dies 310 in accordance with some embodiments. Device die 410 is electrically connected to device die 210 through through-via(s) 325, without going through any through-semiconductor vias in device dies 310.

Figure 31:
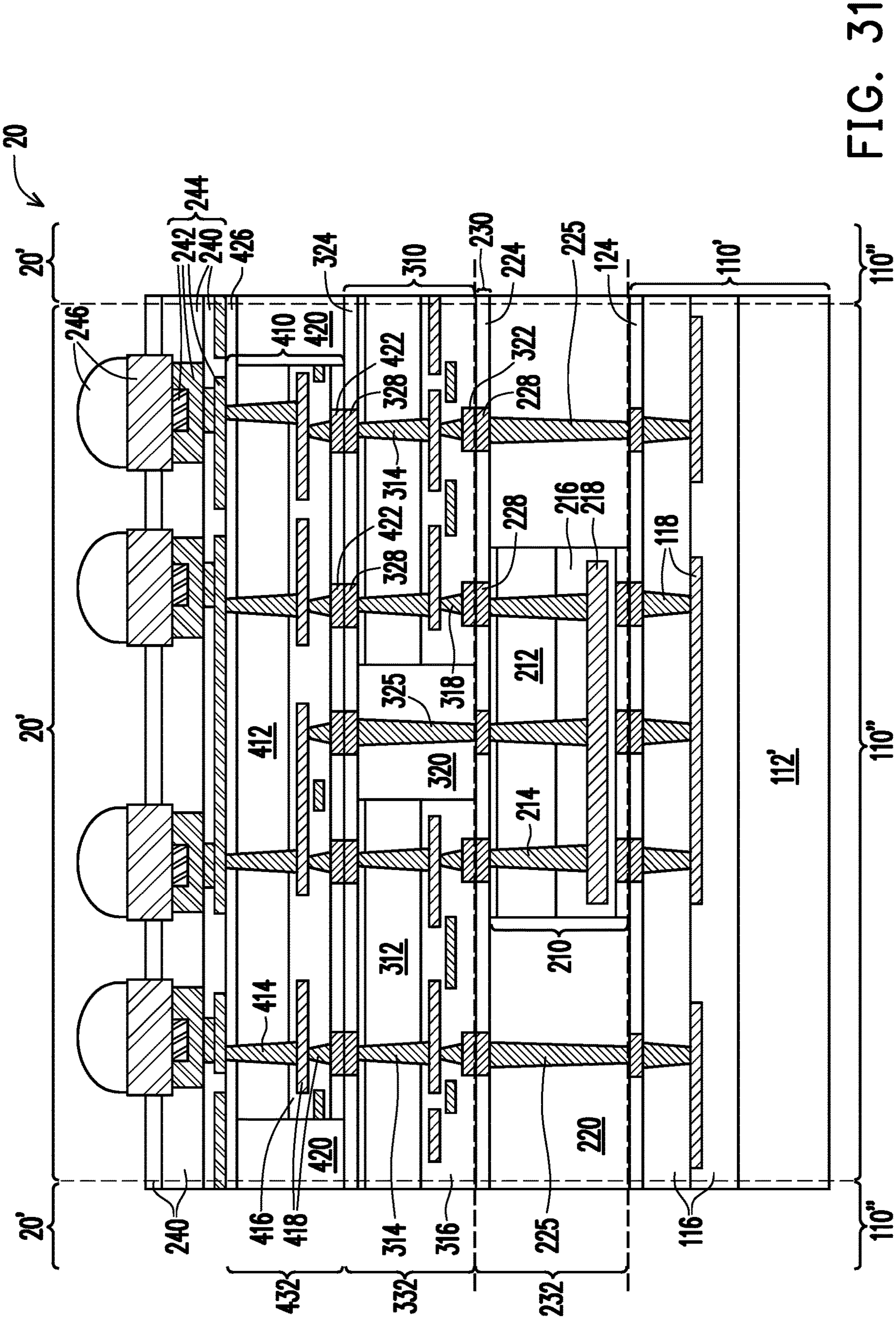

FIG. 31 illustrates the encapsulation of device die 410 in gap-filling regions 420. Reconstructed wafer 432 is thus formed. Semiconductor substrates 412 and gap-filling regions 420 may be recessed, followed by the formation of dielectric layers 426 to encircle the top end portions of through-vias 414 in device dies 410.

Next, interconnect structure 244, which includes dielectric layers 240 and RDLs/bond pads 242, is formed over and electrically connected to device dies 410. Electrical connectors 246 are also formed. Reconstructed wafer 20 is thus formed. In a subsequent process, reconstructed wafer 20 is singulated to form a plurality of identical packages 20'.

Figure 32:
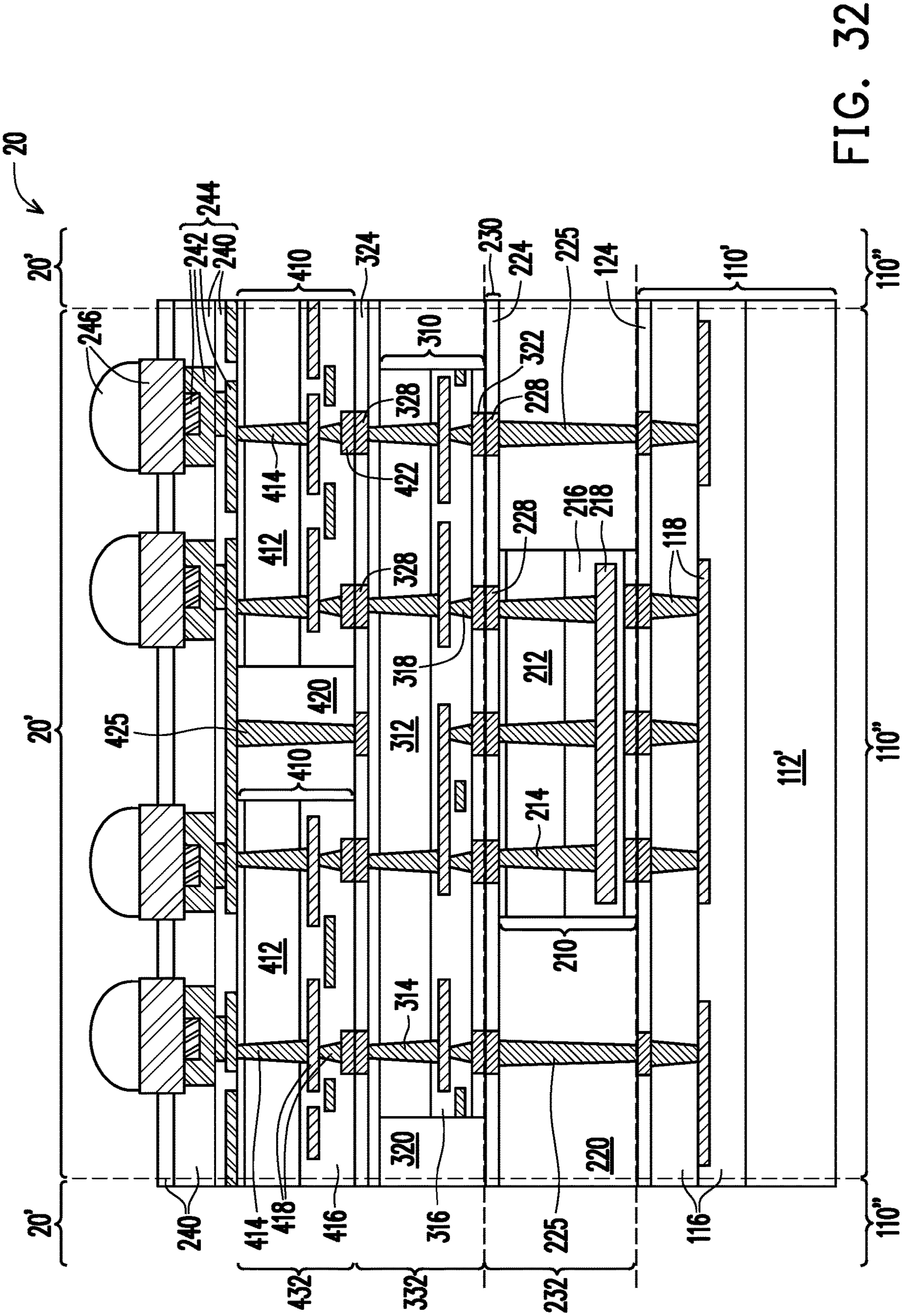
FIG. 32 illustrates a cross-sectional view of a package in accordance with some embodiments.

FIG. 32 illustrates a reconstructed wafer 20 and the corresponding packages 20' in accordance with alternative embodiments. These embodiments are similar to the embodiments as shown in FIG. 31, except that a single device die 310 is bonded to device die 210, and two device dies 410 are bonded to one device die 310. Furthermore, through-via(s) 425 are formed in gap-filling regions 420. In the embodiments in FIGS. 31 and 32, device die 310 extends laterally beyond the edges of device die 210, so that through-vias 225 may be formed directly underlying device die 310, and interconnecting device dies 310 and 110".

Figure 33:
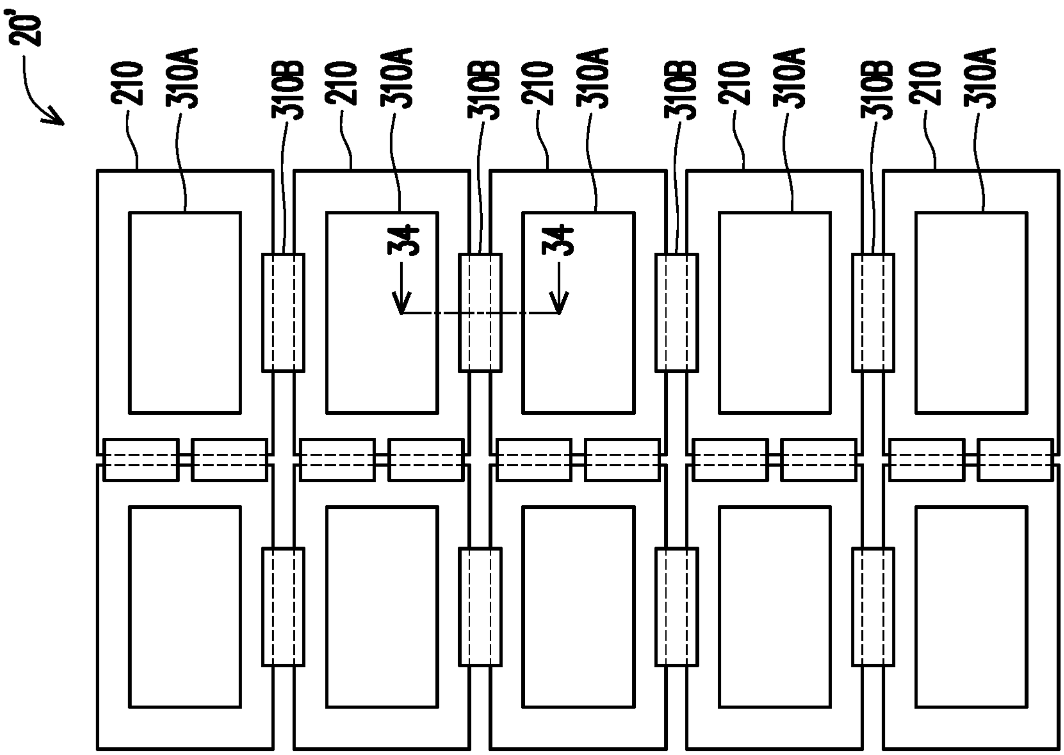
FIGS. 33 and 34 illustrate a top view and a cross-sectional view, respectively, of a package comprising device dies forming arrays in accordance with some embodiments.
Figure 34:
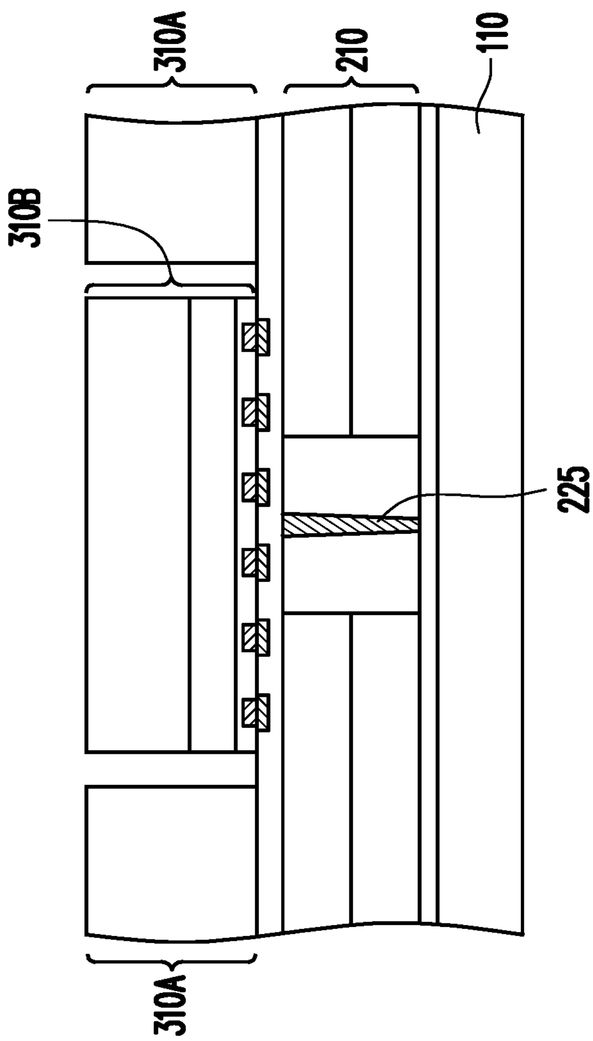

FIGS. 33 and 34 illustrate a top view and a cross-sectional view, respectively, of a part of an example package 20'. In accordance with some embodiments, a plurality of tier-2 device dies 210 are arranged as an array. A plurality of tier-3 device dies 310A and 310B are over and bonded to tier-2 device dies. Tier-3 device dies 310B are bridge dies, with each being bonded to two neighboring device dies 210.

In above-illustrated embodiments, some processes and features are discussed in accordance with some embodiments of the present disclosure to form a three-dimensional (3D) package. Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

In above-discussed embodiments, two to four tiers of device dies are illustrated. In accordance with alternative embodiments, more tiers of device dies may be adopted. In accordance with some example embodiments, the bottom tier may include logic device dies such as CPU dies, GPU dies, or the like, while the upper tiers may include memory device dies.

The embodiments of the present disclosure have some advantageous features. By forming through-dielectric vias in gap-filling regions, the through-dielectric vias replace some of the otherwise through-semiconductor vias, and hence have lower resistivity. The RC delay and voltage drop caused by the through-semiconductor vias and the corresponding metal lines and vias are accordingly reduced.

In accordance with some embodiments of the present disclosure, a method comprises bonding a tier-1 device die to a first carrier; forming a first gap-filling region to encapsulate the tier-1 device die; forming a first redistribution structure over and electrically connected to the tier-1 device die; bonding a first tier-2 device die to the tier-1 device die, wherein the first tier-2 device die is over the tier-1 device die, and the first tier-2 device die extends laterally beyond a corresponding edge of the tier-1 device die; forming a second gap-filling region to encapsulate the first tier-2 device die; removing the first carrier; forming a first through-dielectric via penetrating through the first gap-filling region, wherein the first through-dielectric via is overlapped by, and is electrically connected to, the first tier-2 device die; and forming a second redistribution structure, wherein the first redistribution structure and the second redistribution structure are on opposing sides of the tier-1 device die. In an embodiment, the first redistribution structure comprises a dielectric layer and a first bond pad and a second bond pad, and wherein a third bond pad of the first tier-2 device die is bonded to the first bond pad, and the first through-dielectric via is physically joined to the second bond pad. In an embodiment, the first through-dielectric via is formed before the forming the first redistribution structure. In an embodiment, the first through-dielectric via is formed after the forming the first redistribution structure, and after the removing the first carrier. In an embodiment, the method further comprises, before the removing the first carrier, bonding a second carrier over the first tier-2 device die. In an embodiment, the method further comprises bonding a second tier-2 device die to the tier-1 device die, wherein the second tier-2 device die is over the tier-1 device die, and the tier-1 device die electrically bridges the first tier-2 device die to the second tier-2 device die. In an embodiment, the first redistribution structure is a single-layer redistribution structure comprises a single layer of dielectric; and bond pads having first top surfaces and first bottom surfaces coplanar with corresponding second top surfaces and second bottom surfaces of the single layer of dielectric. In an embodiment, the method further comprises bonding a tier-3 device die to the first tier-2 device die, wherein the tier-3 device die is over the first tier-2 device die, and the tier-3 device die extends laterally beyond a corresponding edge of the first tier-2 device die; and forming a third gap-filling region to encapsulate the tier-3 device die. In an embodiment, the method further comprises forming a second through-dielectric via to penetrate through the first gap-filling region, the first redistribution structure, and the second gap-filling region. In an embodiment, the second through-dielectric via is landed on a metal pad in the second redistribution structure.

In accordance with some embodiments of the present disclosure, a package comprises a first redistribution structure; a tier-1 device die over the first redistribution structure, wherein the tier-1 device die comprises: a first semiconductor substrate; and a first through-semiconductor via penetrating through the first semiconductor substrate; a first gap-filling region encapsulating the tier-1 device die; a second redistribution structure over and electrically connected to the tier-1 device die and the first through-semiconductor via; a first tier-2 device die over and bonded to the tier-1 device die, wherein the first tier-2 device die extends laterally beyond a corresponding edge of the tier-1 device die; a second gap-filling region encapsulating the first tier-2 device die; and a first through-dielectric via penetrating through the first gap-filling region, wherein the first through-dielectric via electrically connects the first tier-2 device die to the first redistribution structure. In an embodiment, the first through-dielectric via is overlapped by the first tier-2 device die. In an embodiment, the package further comprises a tier-3 device die over and bonded to the first tier-2 device die, wherein the tier-3 device die further extends laterally beyond a corresponding edge of the first tier-2 device die; and a third gap-filling region encapsulating the tier-3 device die. In an embodiment, the package further comprises a second through-dielectric via penetrating through the first gap-filling region, the second redistribution structure, and the second gap-filling region. In an embodiment, the second through-dielectric via comprises a portion continuously extending into the first gap-filling region, the second redistribution structure, and the second gap-filling region without interfaces therein. In an embodiment, the package further comprises a second through-dielectric via penetrating through the second gap-filling region, wherein the second through-dielectric via overlaps, and is electrically connected to, the tier-1 device die.

In accordance with some embodiments of the present disclosure, a package comprises a first redistribution structure; a first device die over the first redistribution structure; a first gap-filling region encapsulating the first device die; a second device die over the first device die, wherein the second device die laterally extends beyond a first edge of the first device die; a second gap-filling region encapsulating the second device die; a third device die over the second device die, wherein the third device die laterally extends beyond a second edge of the second device die; a third gap-filling region encapsulating the third device die; a first through-dielectric via in the first gap-filling region, wherein the first through-dielectric via is overlapped by, and is electrically connected to, the second device die; and a second through-dielectric via overlapped by the third device die, wherein the second through-dielectric via penetrates through the first gap-filling region and the second gap-filling region. In an embodiment, the second through-dielectric via comprises a portion continuously extending through the first gap-filling region and the second gap-filling region without interfaces therein. In an embodiment, the second through-dielectric via has a first top end and a first bottom end wider than the first top end. In an embodiment, the first through-dielectric via has a second top end and a second bottom end narrower than the second top end.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:

bonding a tier-1 device die to a first carrier through fusion bonding;

forming a first gap-filling region to encapsulate the tier-1 device die;

forming a first redistribution structure over and electrically connected to the tier-1 device die;

bonding a first tier-2 device die to the tier-1 device die, wherein the first tier-2 device die is over the tier-1 device die, and the first tier-2 device die extends laterally beyond a corresponding edge of the tier-1 device die;

forming a second gap-filling region to encapsulate the first tier-2 device die;

removing the first carrier;

forming a first through-dielectric via penetrating through the first gap-filling region, wherein the first through-dielectric via is overlapped by, and is electrically connected to the first tier-2 device die;

forming a second through-dielectric via to penetrate through the first gap-filling region, the first redistribution structure, and the second gap-filling region, wherein the first through-dielectric via and the second through-dielectric via are formed from different directions; and forming a second redistribution structure, wherein the first redistribution structure and the second redistribution structure are on opposing sides of the tier-1 device die.

2. The method of claim 1, wherein the first redistribution structure comprises a dielectric layer, a first bond pad and a second bond pad, and wherein a third bond pad of the first tier-2 device die is bonded to the first bond pad, and the first through-dielectric via is physically joined to the second bond pad.

3. The method of claim 1, wherein the first through-dielectric via is formed before the forming the first redistribution structure.

4. The method of claim 1 further comprising, before the removing the first carrier, bonding a second carrier over the first tier-2 device die, wherein the second carrier is free from conductive features therein.

5. The method of claim 1 further comprising bonding a second tier-2 device die to the tier-1 device die, wherein the second tier-2 device die is over the tier-1 device die, and the tier-1 device die electrically bridges the first tier-2 device die to the second tier-2 device die.

6. The method of claim 1, wherein the first redistribution structure is a single-layer redistribution structure comprising:

a single layer of dielectric; and bond pads having first top surfaces and first bottom surfaces coplanar with a corresponding second top surface and a corresponding second bottom surface of the single layer of dielectric, and the first top surfaces of the bond pads are in physical contact with additional bond pads of the first tier-2 device die, and wherein the first bottom surfaces of the bond pads are in physical contact with through-substrate vias in the tier-1 device die.

7. The method of claim 1 further comprising:

bonding a tier-3 device die to the first tier-2 device die, wherein the tier-3 device die is over the first tier-2 device die, and the tier-3 device die extends laterally beyond a corresponding edge of the first tier-2 device die; and forming a third gap-filling region to encapsulate the tier-3 device die.

8. The method of claim 1 wherein portions of the second through-dielectric via in the first gap-filling region, the first redistribution structure, and the second gap-filling region are formed in a common formation process.

9. The method of claim 8, wherein the second through-dielectric via is landed on a metal pad in the second redistribution structure.

10. A method comprising:

forming a first gap-filling region encapsulating a tier-1 device die, wherein the tier-1 device die comprises:

a semiconductor substrate; and a through-semiconductor via penetrating through the semiconductor substrate;

forming a first redistribution structure over and electrically connected to the tier-1 device die;

bonding a tier-2 device die over the first redistribution structure, wherein the tier-2 device die extends laterally beyond an edge of the tier-1 device die;

forming a second gap-filling region encapsulating the tier-2 device die;

forming a first through-dielectric via penetrating through the first gap-filling region, wherein the forming the first through-dielectric via comprises:

etching the first gap-filling region to form an opening; and filling the opening with a conductive material;

forming a second redistribution structure, wherein the first redistribution structure and the second redistribution structure are on opposing sides of the tier-1 device die, and wherein the first redistribution structure is electrically connected to the second redistribution structure through the first through-dielectric via; and forming a second through-dielectric via penetrating through the first gap-filling region, the first redistribution structure, and the second gap-filling region, wherein portions of the second through-dielectric via in the first gap-filling region, the first redistribution structure, and the second gap-filling region are formed in a common formation process, and wherein the first through-dielectric via and the second through-dielectric via are formed from different directions.

11. The method of claim 10, wherein the first redistribution structure is further electrically connected to the second redistribution structure through the through-semiconductor via in the tier-1 device die.

12. The method of claim 10 further comprising:

bonding a tier-3 device die over the tier-2 device die, wherein the tier-3 device die further extends laterally beyond an additional edge of the tier-2 device die; and forming a third gap-filling region encapsulating the tier-3 device die.

13. The method of claim 10, wherein the second through-dielectric via continuously extending into the first gap-filling region, the first redistribution structure, and the second gap-filling region without interfaces therein.

14. The method of claim 10, wherein the first through-dielectric via is formed before the tier-2 device die is bonded, and the second through-dielectric via is formed after the tier-2 device die is bonded.

15. The method of claim 10, wherein the first through-dielectric via is formed at a time before the first redistribution structure is formed and after the first gap-filling region is formed.

16. A method comprising:

bonding a first device die over a carrier through fusion bonding;

encapsulating the first device die in a first gap-filling region;

forming a first through-via in the first gap-filling region;

forming a first redistribution structure over and electrically connected to the first through-via and the first device die;

bonding a second device die over the first redistribution structure;

encapsulating the second device die in a second gap-filling region;

removing the carrier;

forming a second through-via penetrating through the first gap-filling region, the first redistribution structure, and the second gap-filling region, wherein the first through-via and the second through-via are formed from opposite directions; and forming a second redistribution structure on an opposing side of the first device die than the first redistribution structure, wherein the first redistribution structure is electrically connected to the second redistribution structure through the first through-via.

17. The method of claim 16, wherein the first redistribution structure is further electrically connected to the second redistribution structure through the first device die.

18. The method of claim 16, wherein the second through-via is free from horizontal interfaces between a topmost surface and a bottommost surface of the second through-via.

19. The method of claim 1, wherein the first through-dielectric via is formed before the first carrier is removed, and the second through-dielectric via is formed after the first carrier is removed.

20. The method of claim 16, wherein the first through-via is formed before the carrier is removed, and the second through-via is formed after the carrier is removed.

* * * * *